(12) United States Patent
Murata et al.

(10) Patent No.: US 8,084,373 B2
(45) Date of Patent: Dec. 27, 2011

(54) MANUFACTURING METHOD OF SEMICONDUCTOR DEVICE FOR ENHANCING THE CURRENT DRIVE CAPABILITY

(75) Inventors: Tatsunori Murata, Kanagawa (JP); Yoshihiro Miyagawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/827,125

(22) Filed: Jun. 30, 2010

(65) Prior Publication Data

US 2011/0003445 A1    Jan. 6, 2011

(30) Foreign Application Priority Data

Jul. 3, 2009    (JP) .................................. 2009-158888

(51) Int. Cl.
*H01L 21/31*    (2006.01)
*H01L 21/469*    (2006.01)

(52) U.S. Cl. ......... 438/787; 438/257; 438/283; 438/778

(58) Field of Classification Search ........ 438/FOR. 131, 438/230, 231, 232, 252, 265, 276, 279, 283, 438/303, 778, 787
See application file for complete search history.

(56) References Cited

U.S. PATENT DOCUMENTS

| 5,525,550 A * | 6/1996 | Kato ............................. 438/788 |
| 2002/0038998 A1 * | 4/2002 | Fujita et al. ................... 313/495 |
| 2005/0189600 A1 | 9/2005 | Ohuchi et al. |
| 2009/0014809 A1 | 1/2009 | Sekine et al. |

FOREIGN PATENT DOCUMENTS

| JP | 2000-114522 A | 4/2000 |
| JP | 2008-60538 A | 3/2008 |

* cited by examiner

*Primary Examiner* — Ha Tran T Nguyen
*Assistant Examiner* — Thanh Y Tran
(74) *Attorney, Agent, or Firm* — Miles & Stockbridge P.C.

(57) ABSTRACT

A manufacturing method of a semiconductor device is provided which can uniformly form a good and thin silicon oxide film or the like at a relatively low temperature. In step 1, a semiconductor substrate is exposed to monosilane ($SiH_4$). Then, in step 2, the remaining monosilane ($SiH_4$) is emitted. In step 3, the semiconductor substrate is exposed to nitrous oxide plasma. A desired silicon oxide film is formed by repeating one cycle including steps 1 to 3 until a necessary thickness of the film is obtained.

10 Claims, 28 Drawing Sheets

MANUFACTURING METHOD OF SEMICONDUCTOR DEVICE FOR ENHANCING THE CURRENT DRIVE CAPABILITY

CROSS-REFERENCE TO RELATED APPLICATIONS

The disclosure of Japanese Patent Application No. 2009-158888 filed on Jul. 3, 2009 including the specification, drawings and abstract is incorporated herein by reference in its entirety.

BACKGROUND OF THE INVENTION

The present invention relates to manufacturing methods of semiconductor devices, and more particularly, to a manufacturing method of a semiconductor device including a metal oxide semiconductor (MOS) transistor.

In recent years, metal oxide semiconductor (MOS) transistors have been required to have an improved current drive capability so as to achieve higher performance of an electronic device and reduction in consumed power of the device. In order to enhance the current drive capability, gate electrodes have been developed which include an insulating film having a higher dielectric constant (High-k film) than that of a $SiO_2$ film or a SiON film as a gate insulating film, and a metal film made of metal material having a predetermined work function as a gate electrode portion. Typically, a hafnium-based oxide film, such as a $HfO_2$ film, a HfON film, or a HfSiON film, is applied as the High-k film, and titanium nitride (TiN) or the like is applied as the metal material.

In source/drain regions of the MOS transistor, extension regions are formed to overlap the gate electrode in shallow junction. The extension region is formed in the following way. First, a polysilicon film, a metal film, and a High-k film, which are to serve as a gate electrode of the MOS transistor, are patterned. Then, an offset spacer having a predetermined thickness is formed on each side of the metal film and High-k film patterned or the like. Thereafter, the extension region is formed by implanting impurity ions of a predetermined conductive type using the offset spacer as a mask.

Conventionally, in the gate electrode formed using the High-k film and the metal film, a silicon nitride (SiN) film is applied as the offset spacer. The silicon nitride film, however, has a relatively high dielectric constant, and thus has limited the improvement of an operation speed of the MOS transistor. Thus, in order to further improve the operation speed of the MOS transistor, the application of a silicon oxide film having a lower dielectric constant has been promoted. For example, Patent Documents 1 and 2 disclose a semiconductor device having an offset spacer formed on each side of a gate electrode made of a High-k film and a metal film.
[Related Art Documents]
[Patent Documents]
[Patent Document 1]
Japanese Unexamined Patent Publication No. 2000-114522
[Non-Patent Document 2]
Japanese Unexamined Patent Publication No. 2008-60538

SUMMARY OF THE INVENTION

The conventional semiconductor devices, however, have the following problems. When a silicon oxide film is intended to be formed by a decompression chemical vapor deposition (CVD) method as an offset spacer for a gate electrode formed using a High-k film and a metal film, the temperature of deposition is relatively high to possibly cause the oxidization of the metal film. This leads to degradation in characteristics of a MOS transistor, such as variations in resistance or the like thereof.

In contrast, when a silicon oxide film is intended to be formed at a relatively low temperature, a fragile silicon oxide film is generally formed, which makes it difficult to form a good silicon oxide film. For example, a high hydrogen content of the silicon oxide film causes failures, including negative bias temperature instability (NBTI), especially in the p-channel type MOSFET (MOS Field Effective Transistor).

The silicon oxide film as the offset spacer is required to be uniformly formed on the side of the gate electrode in a small thickness of about 5 nm so as to ensure the accuracy of dimension of an extension region overlapping the gate electrode.

The present invention has been proposed as part of the above development, and it is an object of the present invention to provide a manufacturing method of a semiconductor device which can uniformly form a good and thin silicon oxide film or the like as an offset spacer at a relatively low temperature.

One manufacturing method of a semiconductor device according to the present invention includes the following steps. A gate electrode is formed in a predetermined region of a main surface of a semiconductor substrate in such a manner as to laminate a metal film having a predetermined work function over a dielectric film having a predetermined dielectric constant. A predetermined offset insulating film is formed so as to cover the side of the gate electrode. An extension region is formed in the predetermined region by setting a part of the offset insulating film positioned over the side of the gate electrode as an offset spacer, and introducing impurities of a predetermined conductive type using the offset spacer as a mask. The step of forming the offset insulating film includes a step of forming a silicon oxide film of a predetermined thickness by repeating one cycle. The cycle includes a first step of adsorbing monosilane ($SiH_4$) to the semiconductor substrate by positioning the semiconductor substrate in a predetermined chamber, introducing the monosilane ($SiH_4$) into the chamber, and exposing the semiconductor substrate to the monosilane ($SiH_4$); a second step of emitting the monosilane ($SiH_4$) remaining in the chamber; and a third step of oxidizing the monosilane ($SiH_4$) adsorbed to the semiconductor substrate by introducing nitrous oxide ($N_2O$) into the chamber, generating plasma from the nitrous oxide, and exposing the semiconductor substrate to the nitrous oxide plasma.

Another manufacturing method of a semiconductor device according to the present invention includes the following steps. A gate electrode is formed in a predetermined region of a main surface of a semiconductor substrate in such a manner as to laminate a metal film having a predetermined work function over a dielectric film having a predetermined dielectric constant. A predetermined offset insulating film is formed so as to cover the side of the gate electrode. An extension region is formed in the predetermined region by setting a part of the offset insulating film positioned over the side of the gate electrode as an offset spacer, and introducing impurities of a predetermined conductive type using the offset spacer as a mask. The step of forming the offset insulating film includes a step of forming a silicon oxide film of a predetermined thickness with carbon added by repeating one cycle. The cycle includes a first step of adsorbing a precursor of carbon to the semiconductor substrate by positioning the semiconductor substrate in a predetermined chamber, introducing either of the trimethylsilane ($Si(CH_3)_3H$) and tetramethylsilane ($Si(CH_3)_4$) as the precursor into the chamber, and exposing the semiconductor substrate to the precursor; a second step of emitting the precursor remaining in the chamber; and a third step of oxidizing the precursor adsorbed to the semiconductor substrate by introducing nitrous oxide ($N_2O$) into the chamber, generating plasma from the nitrous oxide, and exposing the semiconductor substrate to the nitrous oxide plasma.

In the manufacturing method of a semiconductor device according to the invention, the silicon oxide film serving as the offset spacer can be formed under a temperature condition of about 200° C., which can prevent the oxidization of the metal film of the gate electrode. Further, the good silicon oxide film can be formed in which the amount of hydrogen atoms is reduced. Moreover, the thickness of the silicon oxide film can be accurately controlled by changing the number of cycles in the manufacturing method.

In the manufacturing method of a semiconductor device according to the invention, the silicon oxide film containing added carbon and serving as the offset spacer can be formed under a temperature condition of about 200° C., which can prevent the oxidization of the metal film of the gate electrode. Further, the good silicon oxide film with carbon added can be formed in which the amount of hydrogen atoms is reduced. Moreover, the thickness of the silicon oxide film can be accurately controlled by changing the number of cycles in the manufacturing method.

DETAILED DESCRIPTION OF THE PREFERRED EMBODIMENTS

First Embodiment

Figure 1:
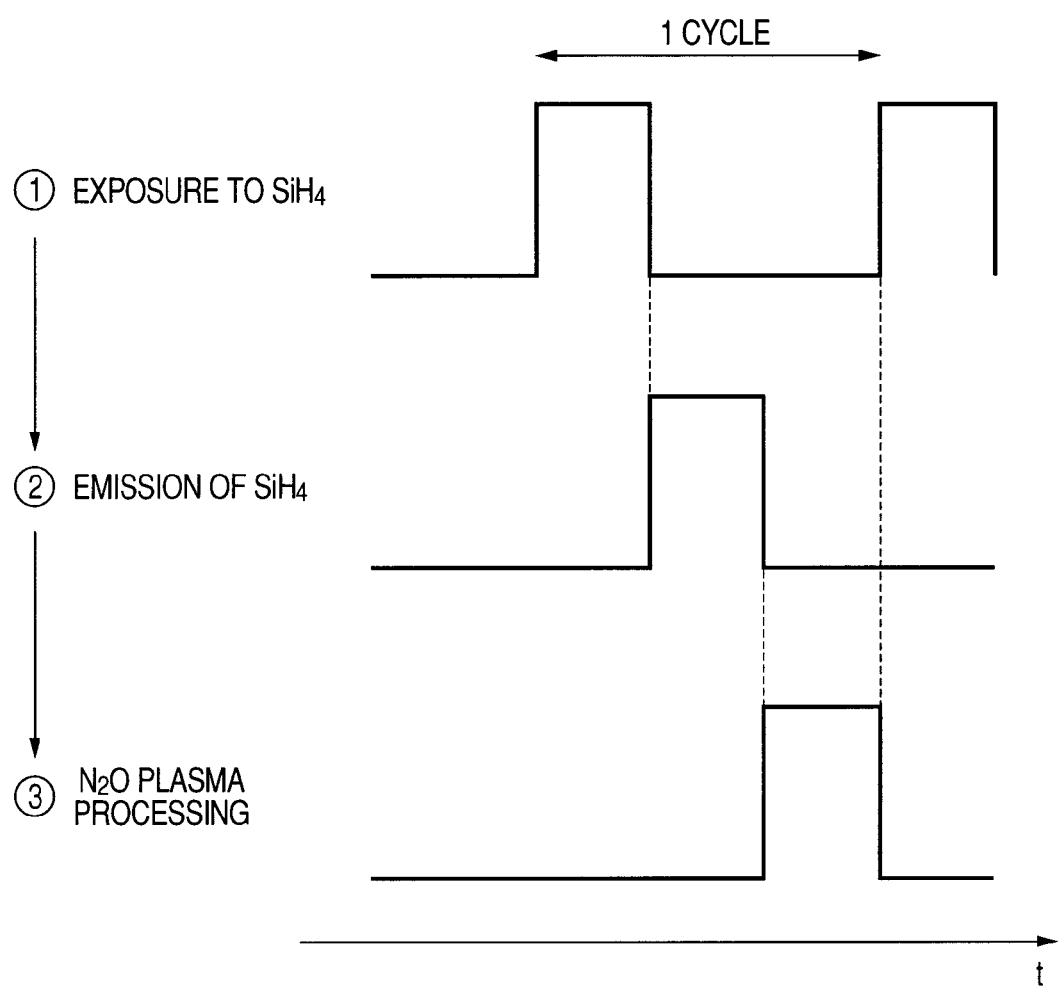
FIG. 1 is a diagram showing respective steps in a manufacturing method of a semiconductor device according to a first embodiment of the invention.

The following will describe a manufacturing method for forming a silicon oxide (SiO) film under low temperature using a commonly-used parallel-plate type plasma CVD device. As shown in FIG. 1, a silicon oxide film is formed by repeating one cycle comprised of three steps a predetermined number of times. First, in step 1, a semiconductor substrate is exposed to silane ($SiH_4$). Then, in step 2, the remaining silane ($SiH_4$) is emitted. Thereafter, the semiconductor substrate is exposed to nitrous oxide plasma in step 3.

Figure 2:
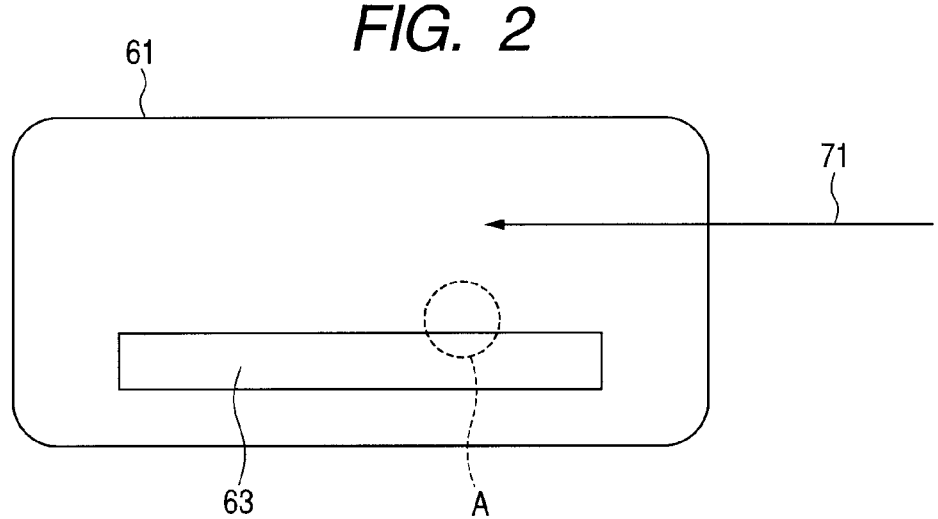
FIG. 2 is a cross-sectional view showing a process in step 1 in this embodiment.
Figure 3:
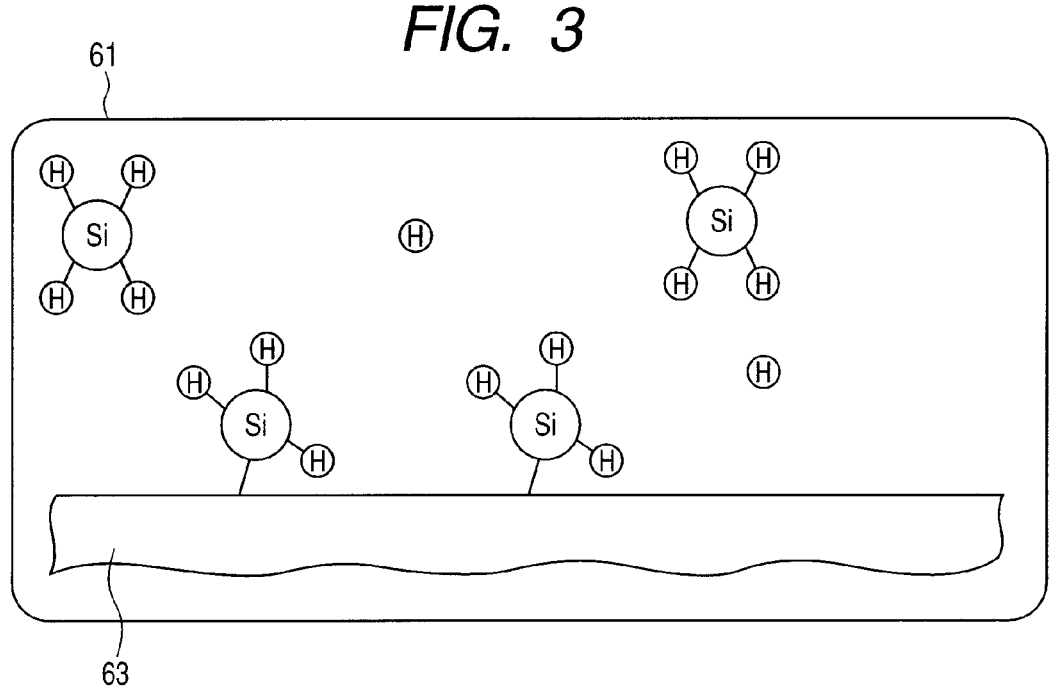
FIG. 3 is a partially enlarged cross-sectional view showing the state of a surface of a semiconductor substrate in step 1 in this embodiment.

The respective steps will be descried in more detail. As shown in FIG. 2, first, a semiconductor substrate 63 is carried into a chamber 61 of the plasma CVD device. In step 1, the temperature of a heater (not shown) provided in the chamber 61 is set to about 200° C. Monosilane ($SiH_4$) diluted with nitrous oxide ($N_2O$) and helium (He) is introduced into the chamber 61 as a carrier gas (as indicated by the arrow 71), so that the semiconductor substrate 63 is exposed to the monosilane ($SiH_4$) for about 2 to 10 seconds. At this time, as shown in FIG. 3, the monosilane ($SiH_4$) is bonded to a dangling bond of an underlayer (semiconductor substrate 63), and thus adsorbed to the underlayer (semiconductor substrate 63). FIG. 3 shows an enlarged part enclosed by the circle A shown in FIG. 2.

The flow rate ratio of, for example, $SiH_4$:$N_2O$:He is 1:30:300 by way of example. In particular, the ratio of the flow rate of He relative to the flow rate of the monosilane ($SiH_4$) of 1 is set to about 300 to 500, so that the monosilane ($SiH_4$) can be uniformly diffused into the chamber. Nitrous oxide ($N_2O$) may be omitted as a carrier gas.

Figure 4:
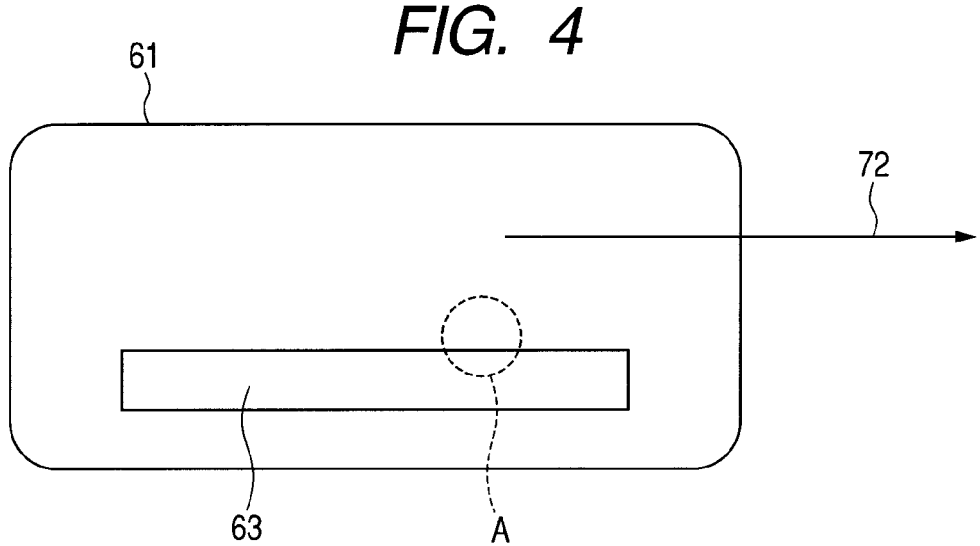
FIG. 4 is a cross-sectional view showing a process in step 2 in this embodiment.
Figure 5:
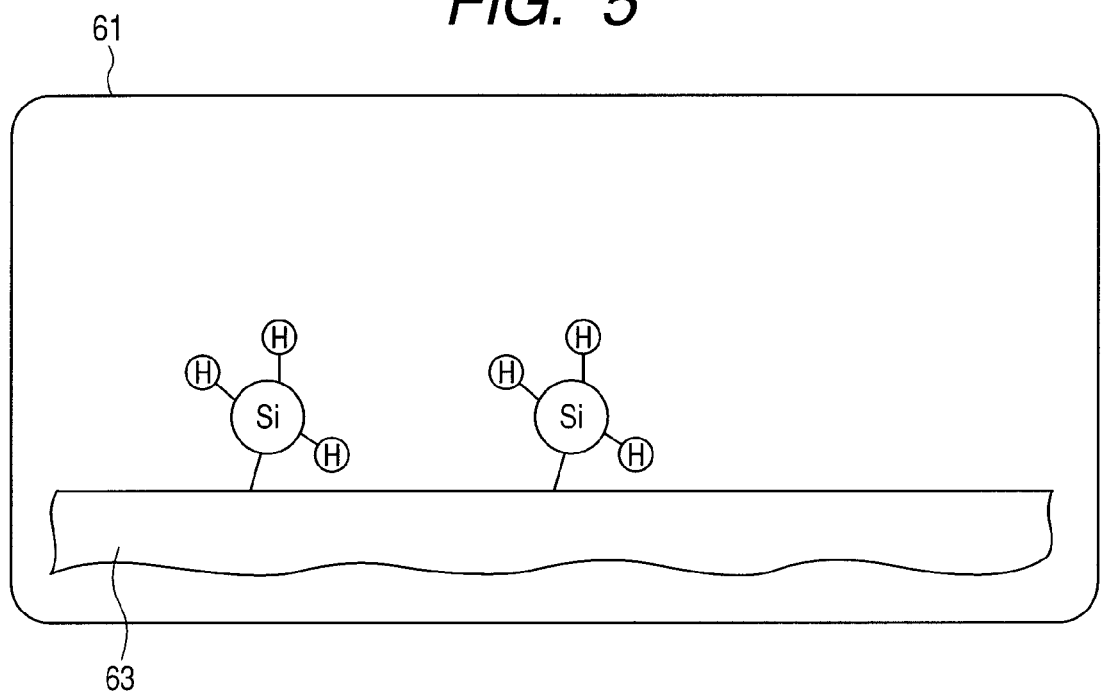
FIG. 5 is a partially enlarged cross-sectional view showing the state of a surface of the semiconductor substrate in step 2 in this embodiment.

Then, in step 2, as shown in FIG. 4, the monosilane ($SiH_4$) remaining in the chamber 61 is sent to the outside of the chamber 61 by evacuating the chamber 61 for about 1 to 5 seconds (as indicated by the arrow 72). At this time, as shown in FIG. 5, the monosilane ($SiH_4$) adsorbed to the underlayer (semiconductor substrate 63) remains as it is without being emitted or exhausted. FIG. 5 is an enlarged diagram of a part enclosed by the circle A shown in FIG. 4. In step 2, helium (He) and nitrous oxide ($N_2O$) may continue to be introduced into the chamber 61 without being emitted.

Figure 6:
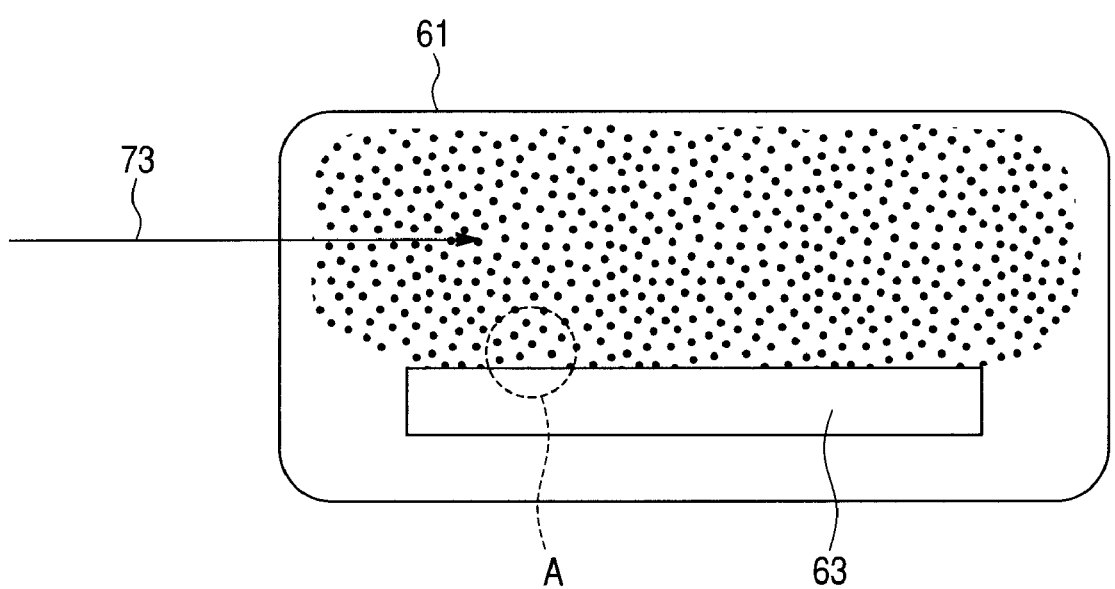
FIG. 6 is a cross-sectional view showing a process in step 3 in this embodiment.

Then, in step 3, as shown in FIG. 6, nitrous oxide ($N_2O$) and helium (He) are introduced into the chamber 61 (as indicated by the arrow 73) to generate nitrous oxide plasma. The semiconductor substrate 63 is exposed to the nitrous oxide plasma for about 10 seconds. At this time, as one example of the gas flow ratio, for example, the ratio of the flow rate of He to $N_2O$ of 1 is set to about 5 to 10. A RF power is set to, for example, 0.1 to 1 $W/cm^2$.

Figure 7:
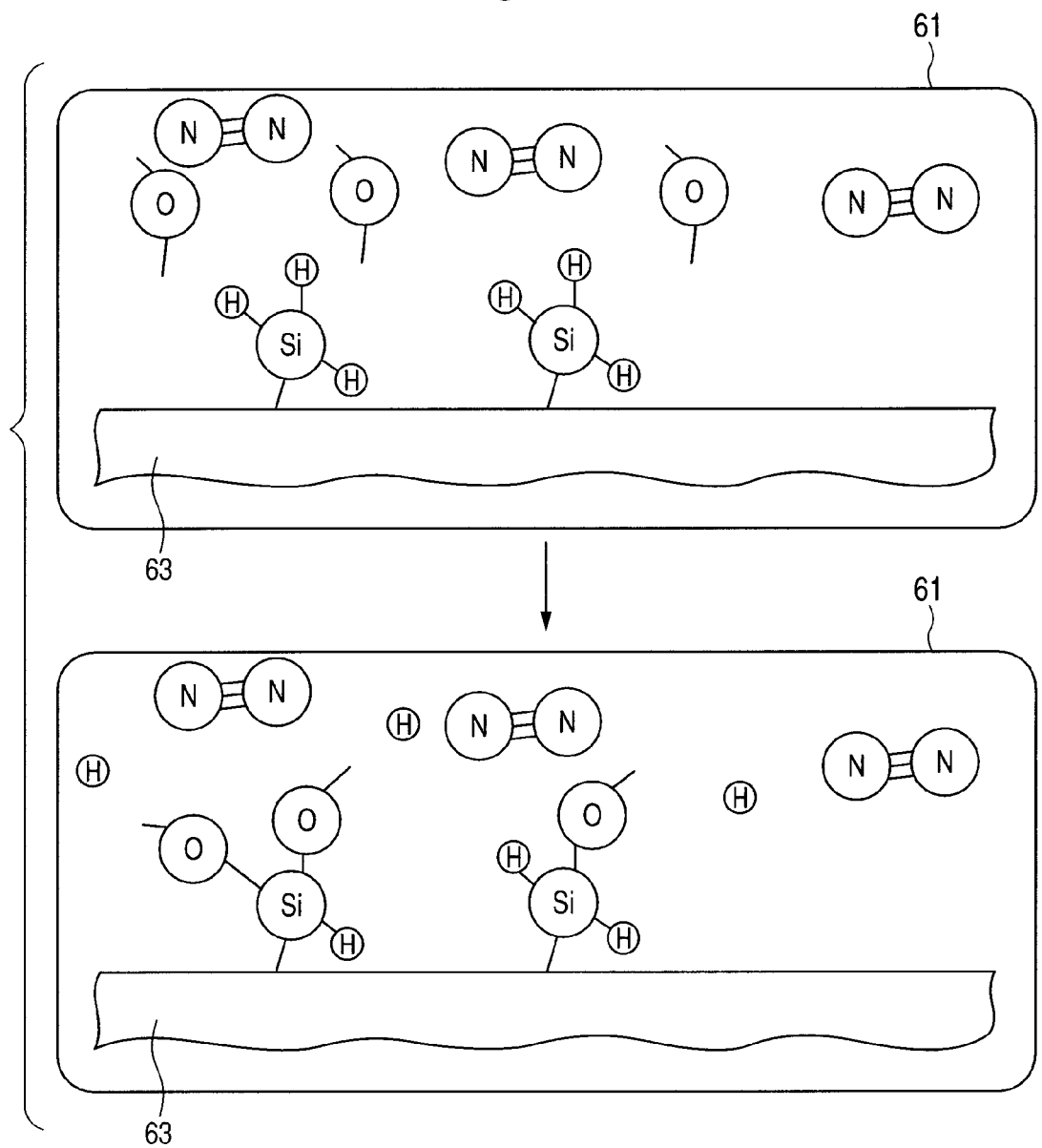
FIG. 7 is a partially enlarged cross-sectional view showing the state of a surface of the semiconductor substrate in step 3 in this embodiment.

As shown in FIG. 7, the nitrous oxide is decomposed into nitrogen ($N_2$) and oxygen atoms (O) by the nitrous oxide plasma. A hydrogen atom (H) of the monosilane ($SiH_4$) adsorbed to the underlayer (semiconductor substrate 63) is substituted by the oxygen atom (O) to form a single SiO layer. The thus-obtained silicon oxide film has a higher probability of being formed in the form of a silicon oxide film including a silicon atom (Si) bonded to one oxygen atom (O), rather than a silicon oxide film including a silicon atom (Si) bonded to two oxygen atoms (O). This silicon oxide film is referred to as a "SiO film" in this specification. FIG. 7 is an enlarged diagram of a part enclosed by the circle A shown in FIG. 6.

A desired silicon oxide film is formed by repeating one cycle including steps 1 to 3 until a necessary thickness of the film is obtained. The semiconductor substrate 63 having the desired silicon oxide film formed thereat is taken out of the chamber 61.

Figure 8:
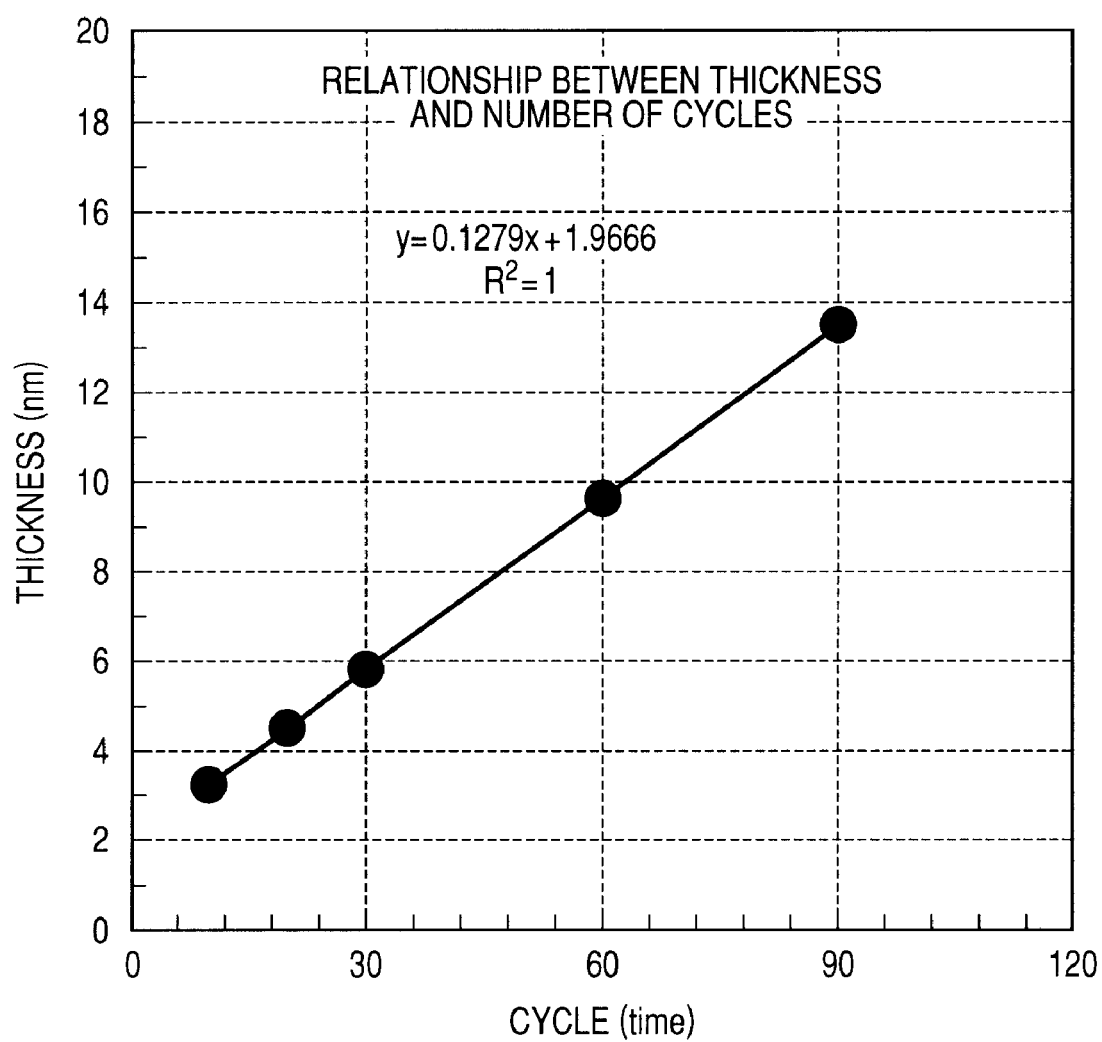
FIG. 8 is a graph showing the relationship between the thickness of a silicon oxide film and the number of cycles in this embodiment.

In the above manufacturing method, a single molecular layer of monosilane is formed every cycle, and then the single molecular layer is oxidized to form each silicon oxide film. This method is called "atomic layer deposition (ALD)" method. FIG. 8 is a graph showing the relationship between the number of cycles and the thickness of the silicon oxide film measured by the inventors. The horizontal axis is the number of cycles, and the longitudinal axis is the thickness of the silicon oxide film.

As can be seen from FIG. 8, the thickness of the silicon oxide film is proportional to the number of cycles. This means that the amount of monosilane ($SiH_4$) adsorbed to the underlayer and then oxidized by the nitrous oxide plasma in each cycle is constant. The gradient of the graph estimates the thickness of the silicon oxide film formed in one cycle to be about 0.13 nm. Therefore, it is found that the above manufacturing method can accurately control the thickness of the silicon oxide film by changing the number of cycles.

In the above manufacturing method, when the monosilane ($SiH_4$) adsorbed to the underlayer (semiconductor substrate 63) is oxidized by the nitrous oxide plasma, the hydrogen atom (H) of the monosilane ($SiH_4$) is removed as water ($H_2O$) by an oxygen (O) radical. Thus, the amount of hydrogen atoms (H) contained in the silicon oxide film can be reduced.

Figure 9:
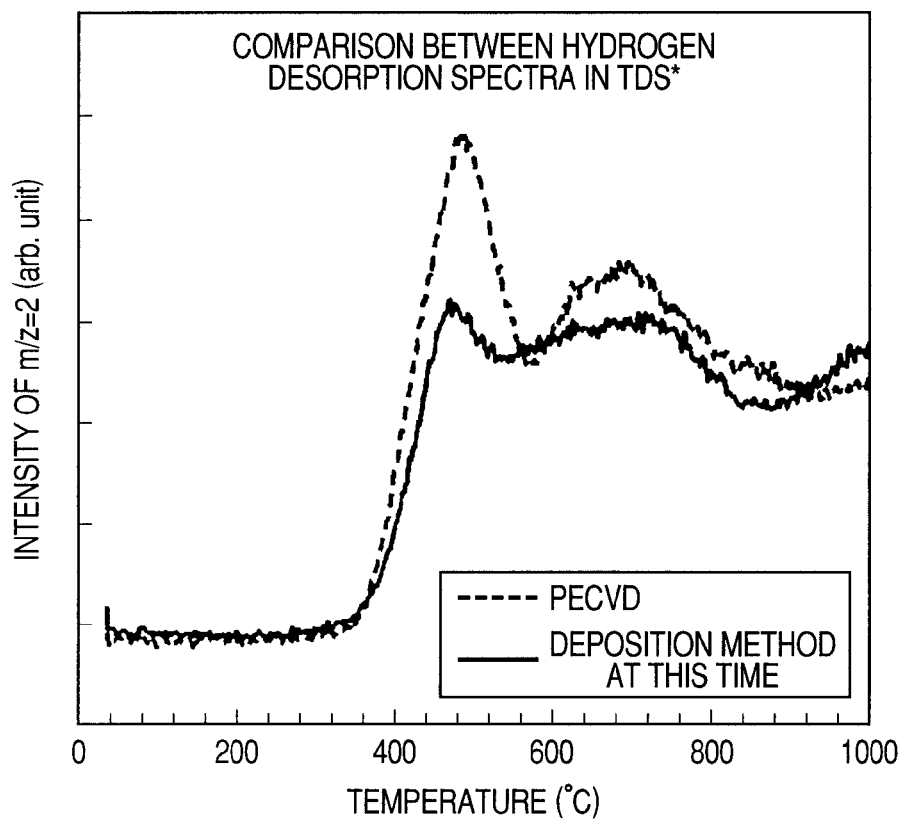
FIG. 9 is a diagram showing hydrogen desorption spectra provided by a thermal desorption spectrometer in this embodiment.

FIG. 9 shows hydrogen desorption spectra measured by the inventors using a thermal desorption spectroscopy (TDS). The horizontal axis corresponds to the temperature, and the longitudinal axis corresponds to the amount of hydrogen. The graph with a solid line (graph A) indicates a hydrogen desorption spectrum of the silicon oxide film formed by the above manufacturing method. The graph with a dotted line (graph B) indicates a hydrogen desorption spectrum of a silicon oxide film formed by a conventional plasma CVD method.

As shown in FIG. 9, the graph B shows that the amount of desorption of hydrogen increases at temperature of 400 to 500° C., whereas the graph A shows that the amount of desorption of hydrogen is small. This is because the amount of hydrogen atoms (H) captured in the silicon oxide film is decreased, resulting in a decrease in amount of desorption of hydrogen gas. Therefore, it is found that the above manufacturing method can form the good silicon oxide film whose hydrogen (atom) content is small.

In the above manufacturing method, such a good silicon oxide film can be formed at a relatively low temperature of about 200° C. When the deposition temperature in forming the silicon oxide film as the offset spacer is high in the case of the gate electrode formed using the High-k film and the metal film as a gate electrode of the MOS transistor, the metal film of the gate electrode may be oxidized, which leads to variations in resistance, and thus degrades the characteristics of the MOS transistor, including current drive capability.

The silicon oxide film which is such an offset spacer is formed under the above temperature condition of about 200° C., which can prevent oxidization of the metal film of the gate electrode, and can suppress thermal diffusion of material contained in the silicon oxide film. As a result, the characteristics of the MOS transistor, including the current drive capability, can be improved.

Second Embodiment

The following will describe a case where the above-mentioned forming method of the silicon oxide film (SiO film) is applied to the formation of the offset spacer of the MOS transistor.

Figure 10:
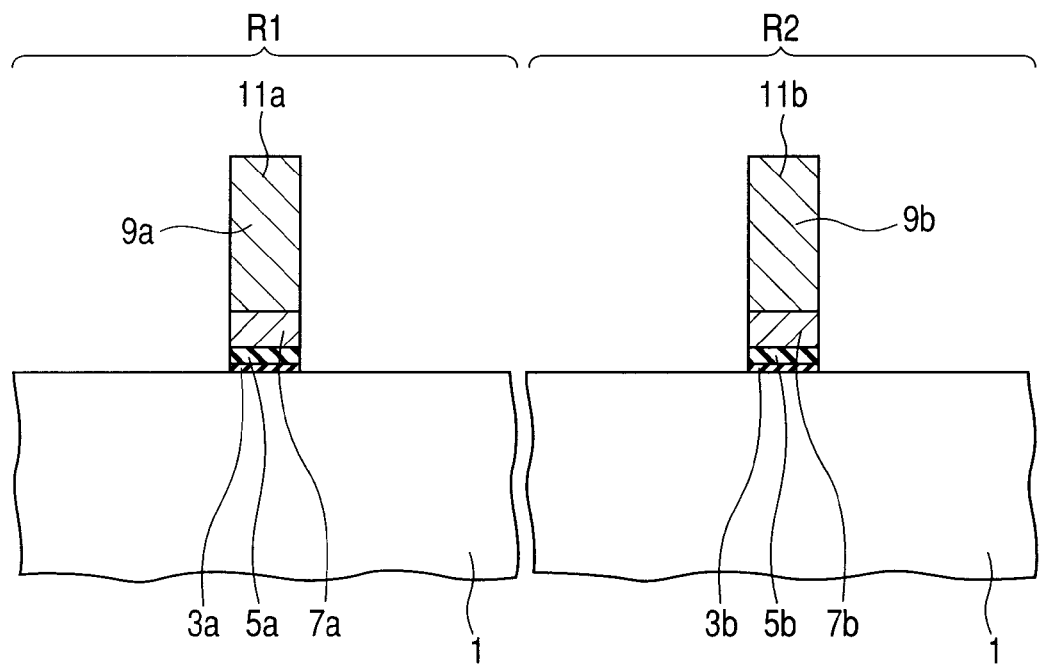
FIG. 10 is a cross-sectional view showing one process in a manufacturing method of a semiconductor device according to a second embodiment of the invention.

First, as show in FIG. 10, in an nMOS region R1 of the semiconductor substrate 1, a High-k film 5a having a predetermined dielectric constant, a metal film 7a having a predetermined work function, and a polysilicon film 9a are laminated on an interlayer 3a thereby to form a gate electrode 11a of an n-channel MOSFET transistor. In contrast, in a pMOS region R2 of the semiconductor substrate 1, a High-k film 5b having a predetermined dielectric constant, a metal film 7b having a predetermined work function, and a polysilicon film 9b are laminated on an interlayer 3b thereby to form a gate electrode 11b of a p-channel MOSFET transistor.

For example, a film made of SiO, SiON, or the like is used as the interlayer 3a or 3b. For example, a hafnium-based High-k film made of HfSiON, HfON, $HfO_2$, or the like is used as the High-k film 5a or 5b. On the High-k film 5a in the nMOS region R1, a cap film (not shown) made of LaO, La, or the like is formed so as to adjust a threshold voltage of the n-channel MOS transistor. On the High-k film 5b in the pMOS region R2, a cap film (not shown) made of AlO, Al, or the like is formed so as to adjust a threshold voltage of the p-channel MOS transistor.

Materials for the metal film include transition metal, such as titanium (Ti), tantalum (Ta), nickel (Ni), zirconium (Zr), ruthenium (Ru), cobalt (Co), or tungsten (W), and metal nitride, such as titanium nitride (TiN). Different materials are respectively used for the metal film 7a and the metal film 7b so as to adjust the threshold voltage of the n-channel MOS transistor and the threshold voltage of the p-channel MOS transistor.

Figure 11:
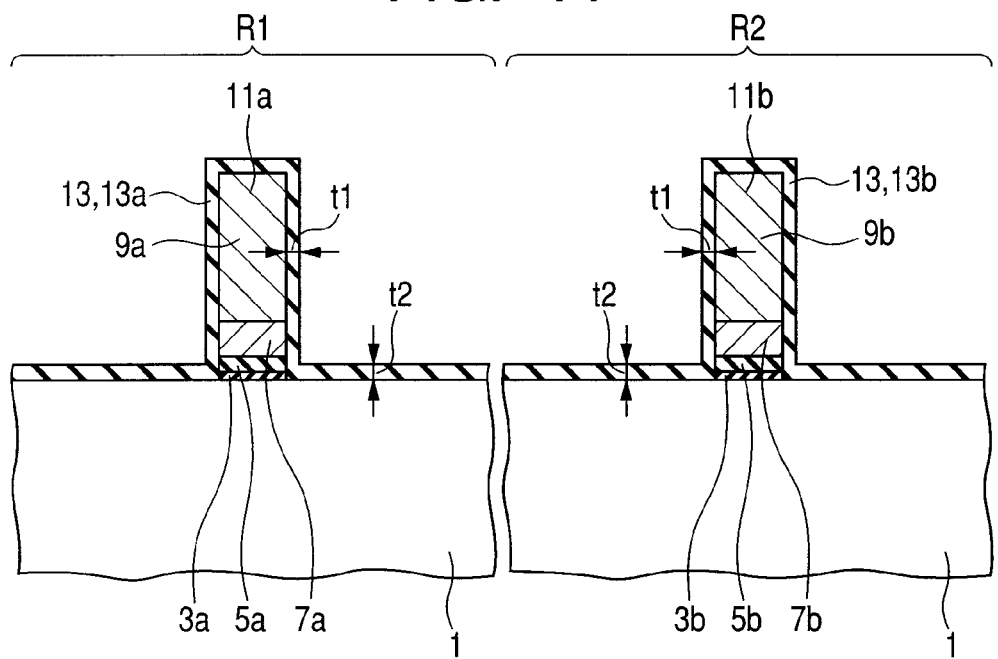
FIG. 11 is a cross-sectional view showing a process performed after the process shown in FIG. 10 in this embodiment.

Thus, after patterning the gate electrodes 11a and 11b, as shown in FIG. 11, a silicon oxide film 13 of about several nm in thickness is formed over the semiconductor substrate 1 so as to cover gate electrodes 11a and 11b. At this time, the silicon oxide film 13 is formed by the above-mentioned forming method.

Figure 12:
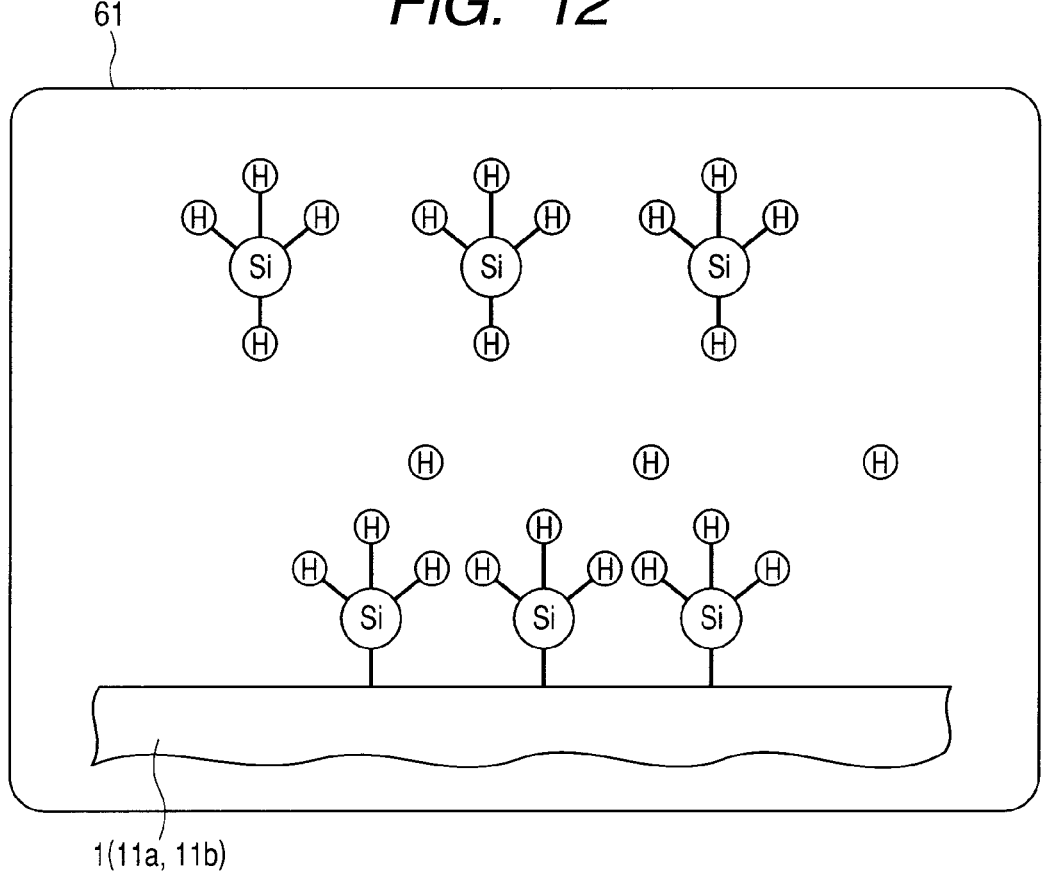
FIG. 12 is a partially enlarged cross-sectional view showing the state of a surface of a semiconductor substrate in step 1 of the process shown in FIG. 11 in this embodiment.

As shown in FIG. 12, the semiconductor substrate 1 with the gate electrodes 11a and 11b formed thereat is carried, for example, into the chamber 61 of the parallel-plate type plasma CVD device. The temperature of the heater (not shown) in the chamber 61 is set to about 200° C. Monosilane ($SiH_4$) diluted with the nitrous oxide ($N_2O$) and helium (He) is introduced into the chamber 61 as a carrier gas, and the semiconductor substrate 1 is exposed to the monosilane for about 2 to 10 seconds (in step 1).

At this time, the monosilane ($SiH_4$) is bonded to a dangling bond of the surface of the semiconductor substrate 1 (gate electrodes 11a and 11b), whereby the monosilane ($SiH_4$) is adsorbed to the semiconductor substrate 1. As mentioned above, the flow rates of respective gases are controlled and set at a predetermined flow rate ratio, so that the monosilane ($SiH_4$) can be uniformly diffused into the chamber 61.

Figure 13:
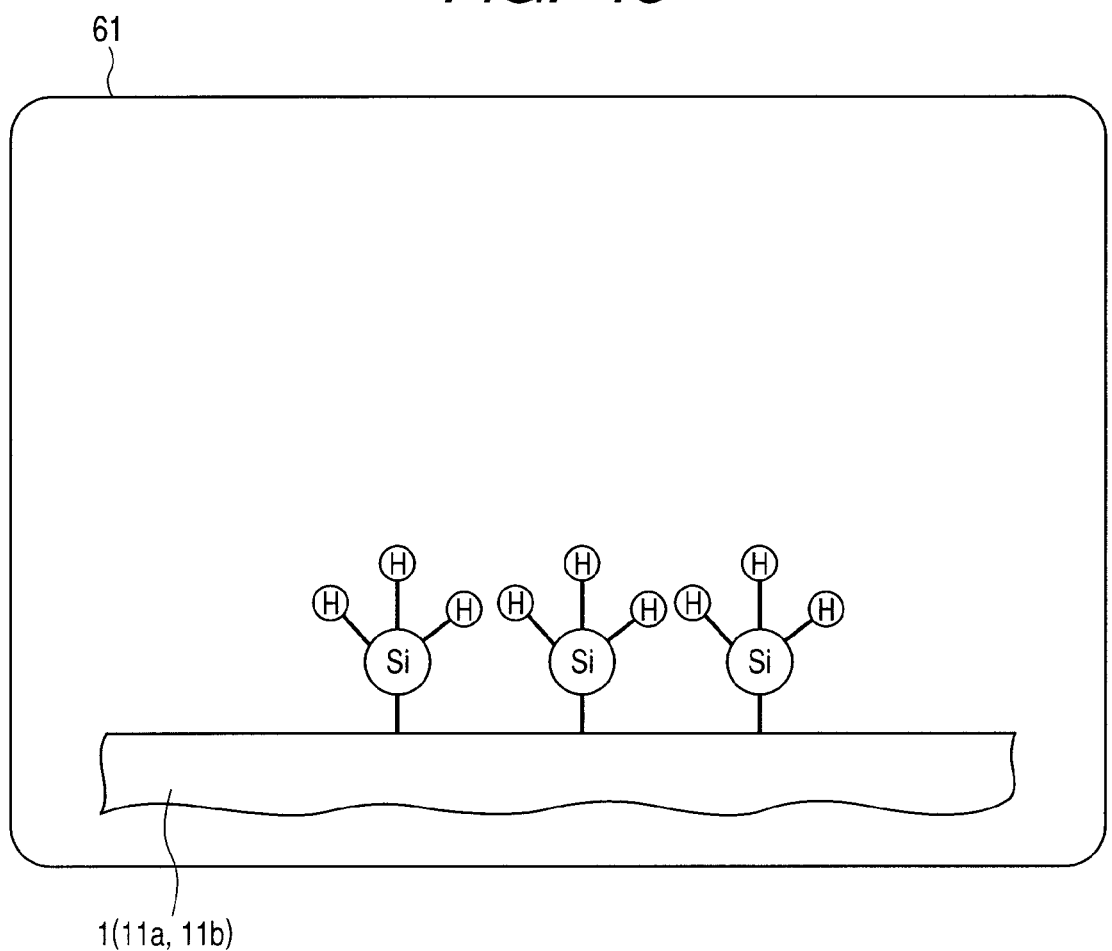
FIG. 13 is a partially enlarged cross-sectional view showing the state of a surface of a semiconductor substrate in step 2 of the process shown in FIG. 11 in this embodiment.

Then, as shown in FIG. 13, the monosilane ($SiH_4$) or the like remaining in the chamber 61 is sent to the outside of the chamber 61 by evacuating the chamber 61 for about 1 to 5 seconds (step 2). At this time, the monosilane ($SiH_4$) adsorbed to the semiconductor substrate 1 remains as it is without being emitted or exhausted. In step 2, the helium (He) and the nitrous oxide ($N_2O$) may continue to be introduced into the chamber 61 without being emitted.

Figure 14:
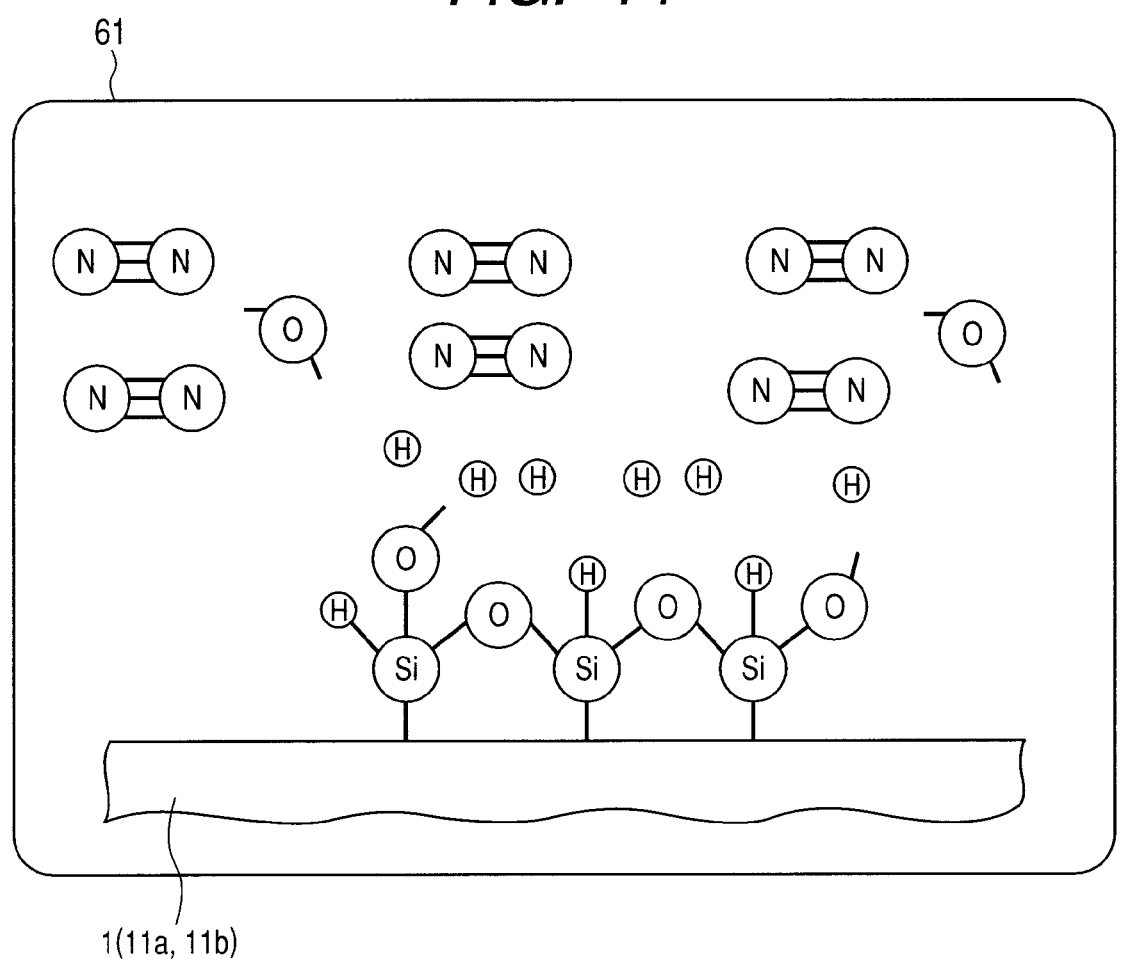
FIG. 14 is a partially enlarged cross-sectional view showing the state of a surface of a semiconductor substrate in step 3 of the process shown in FIG. 11 in this embodiment.

Then, as shown in FIG. 14, nitrous oxide ($N_2O$) and helium (He) are introduced into the chamber 61 to generate nitrous oxide plasma, and the semiconductor substrate 1 is exposed to the nitrous oxide plasma for about 10 seconds (in step 3). The above-mentioned conditions regarding the flow rate rates of the respective gases and RF powers are adopted. The nitrous oxide is decomposed into nitrogen ($N_2$) and oxygen atoms (O) by the nitrous oxide plasma. A hydrogen atom (H) of the monosilane ($SiH_4$) adsorbed to the semiconductor substrate 1 is substituted by the oxygen atom (O) to form a single SiO layer (film).

The silicon oxide film 13 (see FIG. 11) having a desired thickness is formed over the semiconductor substrate 1 so as to cover the gate electrodes 11a and 11b by repeating one cycle including steps 1 to 3 until a necessary thickness of the film is obtained. At this time, a thickness t1 of a part of the silicon oxide film 13 covering the sides of the gate electrodes 11a and 11b is smaller than a thickness t2 of a part of the film 13 covering the upper surface of the semiconductor substrate 1. The part of the silicon oxide film 13 covering the sides of the gate electrodes 11a and 11b is more thinned, which can enhance the controllability of implantation of an extension region, and can advantageously fill a gap between the gate electrodes in the following process. In contrast, the part of the silicon oxide film 13 covering the upper surface of the semiconductor substrate 1 is more thickened, which can reduce damage in implantation of the extension region. Among the thus-formed silicon oxide film 13, the silicon oxide film covering the gate electrode 11a is referred to as a silicon oxide film 13a, and the silicon oxide film covering the gate electrode 11b is referred to as a silicon oxide film 13b.

Figure 15:
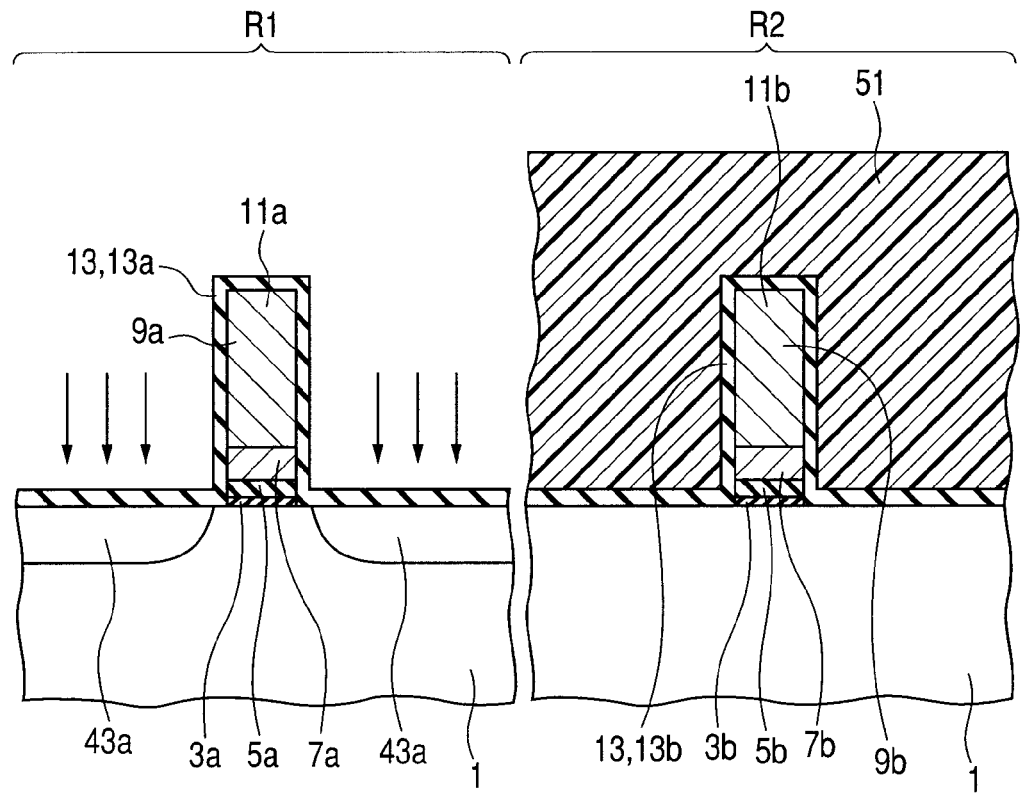
FIG. 15 is a cross-sectional view showing a process performed after the process shown in FIG. 11 in this embodiment.

Then, as shown in FIG. 15, a resist pattern 51 is formed in such a manner as to expose the nMOS region R1, while covering the pMOS region R2. In the nMOS region R1, among the silicon oxide film 13a, parts of the silicon oxide film 13a positioned on the sides of the gate electrode 11a serve as an offset spacer.

Then, for example, n-type impurity ions, such as arsenic (As) or phosphorus (P), are implanted (as indicated by the arrow) using the offset spacer or the like made of the part of the silicon oxide film 13a as a mask thereby to form n-type extension implantation regions 43a in a predetermined depth from the surface of the semiconductor substrate 1. Thereafter, an ashing process is applied to the semiconductor substrate in an oxygen plasma atmosphere thereby to remove the resist pattern 51.

Figure 16:
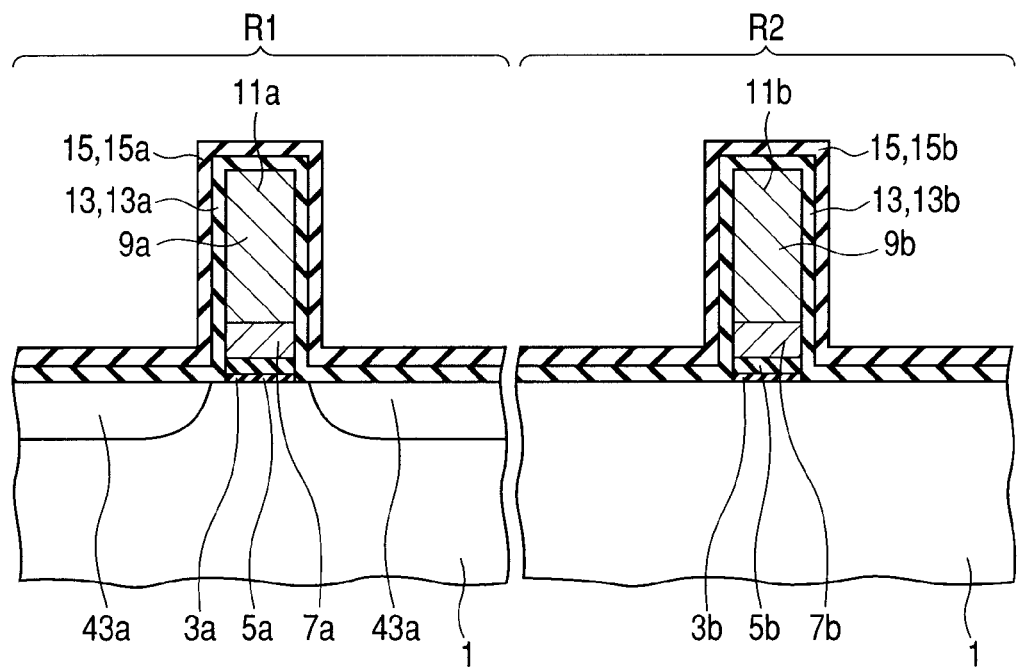
FIG. 16 is a cross-sectional view showing a process performed after the process shown in FIG. 15 in this embodiment.

Then, as shown in FIG. 16, a silicon oxide film 15 is further formed so as to cover the silicon oxide film 13. The silicon oxide film 15 is also preferably formed by the above-mentioned forming method. In the same way as the case where the silicon oxide film 13 is formed, the silicon oxide film 15 having a desired thickness is formed by repeating one cycle including steps 1 to 3 until a necessary thickness of the film is obtained. At this time, like the silicon oxide film 13, the thickness of a part of a silicon oxide film 14 covering the sides of the gate electrodes 11a and 11b is smaller than the thickness of a part of the film 14 covering the upper surface of the semiconductor substrate 1. This structure can improve the controllability of implantation and the filling property of the gap between the gate electrodes, while reducing the damage in implantation. Among the thus-formed silicon oxide film 15, the silicon oxide film covering the gate electrode 11a is referred to as a silicon oxide film 15a, and the silicon oxide film covering the gate electrode 11b is referred to as a silicon oxide film 15b.

Figure 17:
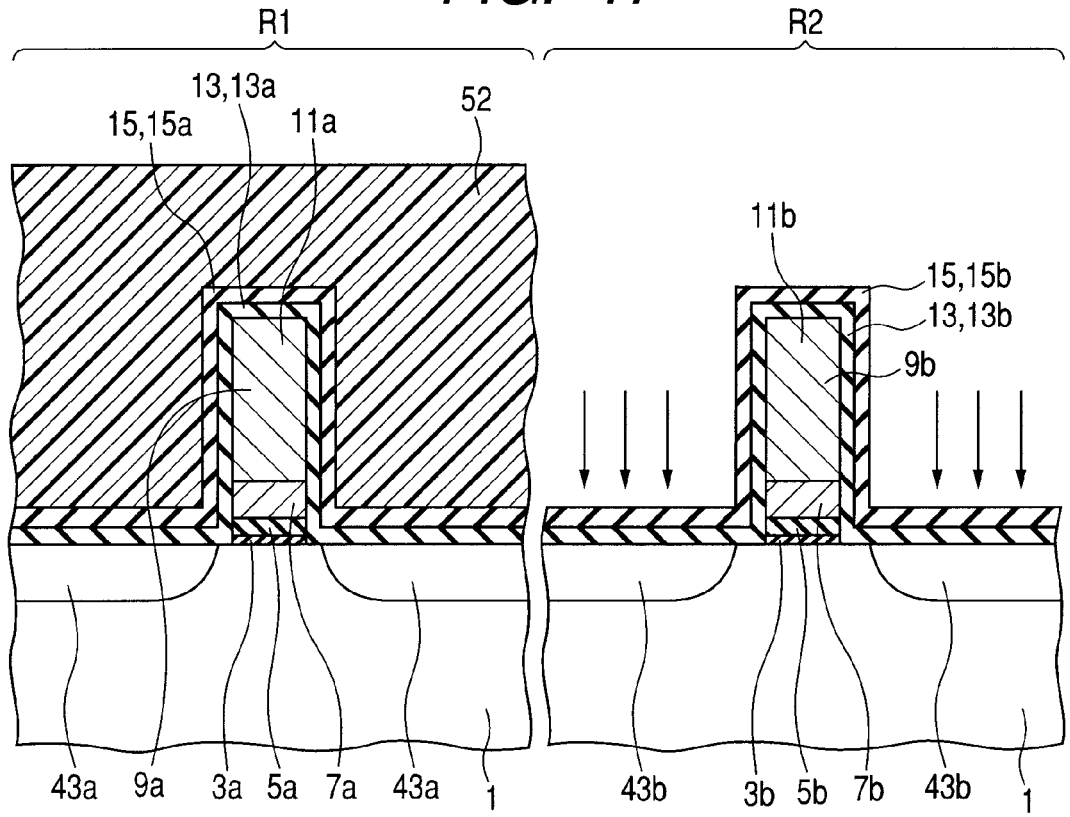
FIG. 17 is a cross-sectional view showing a process performed after the process shown in FIG. 16 in this embodiment.

Then, as shown in FIG. 17, a resist pattern 52 is formed in such a manner as to cover the nMOS region R1, while exposing the pMOS region R2. In the pMOS region R2, among the silicon oxide films 13b and 15b, the parts of the silicon oxide films 13b and 15b positioned on the sides of the gate electrode 11b serve as the offset spacer.

Then, p-type impurity ions, such as boron fluoride ($BF_2$), boron (B), or indium (In), are implanted (as indicated by the arrow) using the offset spacer or the like comprised of the parts of the silicon oxide films 13b, 15b as a mask thereby to form p-type extension implantation regions 43b in a predetermined depth from the surface of the semiconductor substrate 1. Therefore, an ashing process is applied to the semiconductor substrate in an oxygen plasma atmosphere thereby to remove the resist pattern 52.

Figure 18:
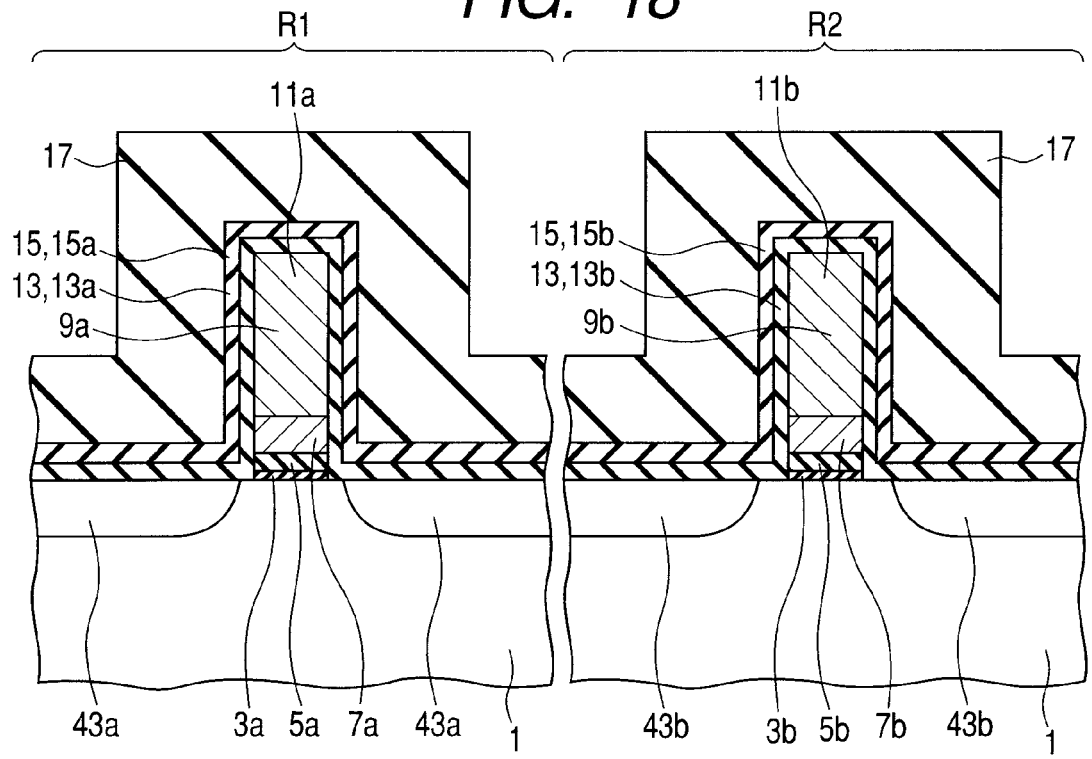
FIG. 18 is a cross-sectional view showing a process performed after the process shown in FIG. 17 in this embodiment.
Figure 19:
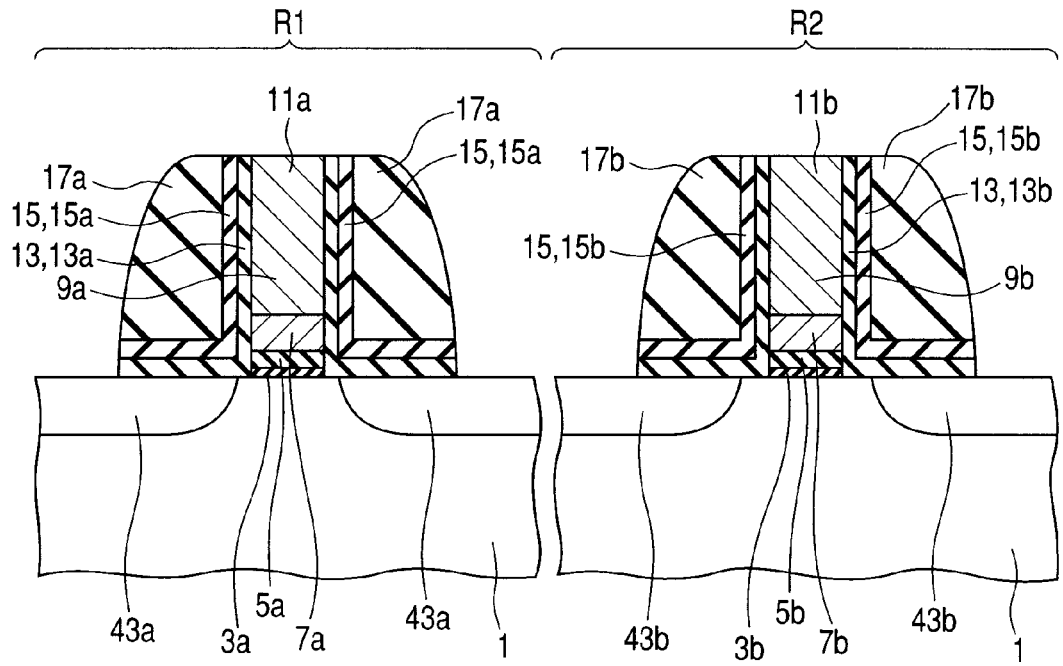
FIG. 19 is a cross-sectional view showing a process performed after the process shown in FIG. 18 in this embodiment.

Then, as shown in FIG. 18, an insulating film 17 is formed over the semiconductor substrate 1 so as to cover the gate electrodes 11a and 11b. The insulating film 17 is preferably formed of a silicon oxide film, a silicon nitride film, or a laminated film thereof. Then, as shown in FIG. 19, the insulating film 17 is subjected to anisotropic etching to form sidewall insulating films 17a on the sides of the gate electrode 11a, and sidewall insulating films 17b on the sides of the gate electrode 11b.

Then, a resist pattern (not shown) is formed in such a manner as to expose the nMOS region R1, while covering the pMOS region R2. N-type impurity ions, such as arsenic (As) or phosphorus (P), are implanted (as indicated by the arrow) using the resist pattern and the sidewall insulating film 17a or the like as a mask thereby to form the n-type source/drain implantation regions (not shown) in a predetermined depth from the surface of the semiconductor substrate 1 in the nMOS region R1.

On the other hand, a resist pattern (not shown) is formed in such a manner as to expose the nMOS region R1, while covering the pMOS region R2. P-type impurity ions, such as boron fluoride ($BF_2$), boron (B), or indium (In), are implanted (as indicated by the arrow) using the resist pattern, and the sidewall insulating film 17b or the like as a mask thereby to form the p-type source/drain implantation regions (not shown) in a predetermined depth from the surface of the semiconductor substrate 1 in the pMOS region R2.

Figure 20:
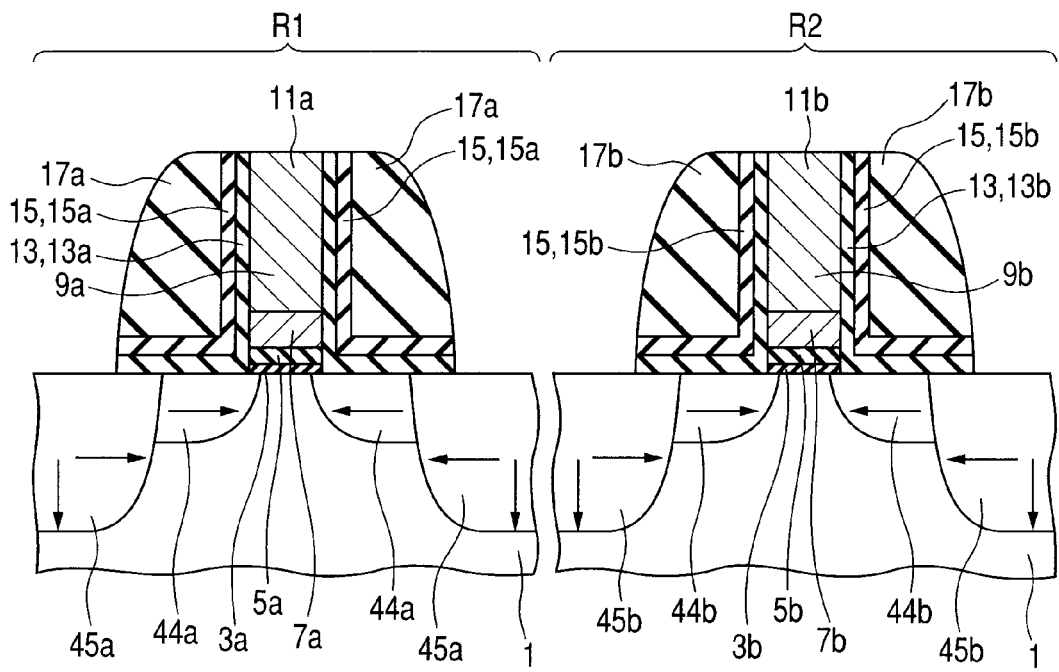
FIG. 20 is a cross-sectional view showing a process performed after the process shown in FIG. 19 in this embodiment.

Then, predetermined heat treatment is performed to thermally diffuse impurity ions implanted in the extension implantation regions 43a and 43b and the source/drain implantation regions, so that extension regions 44a and source/drain regions 45a are formed in the nMOS region R1 as shown in FIG. 20. On the other hand, extension regions 44b and source/drain regions 45b are formed in the pMOS region R2.

Figure 21:
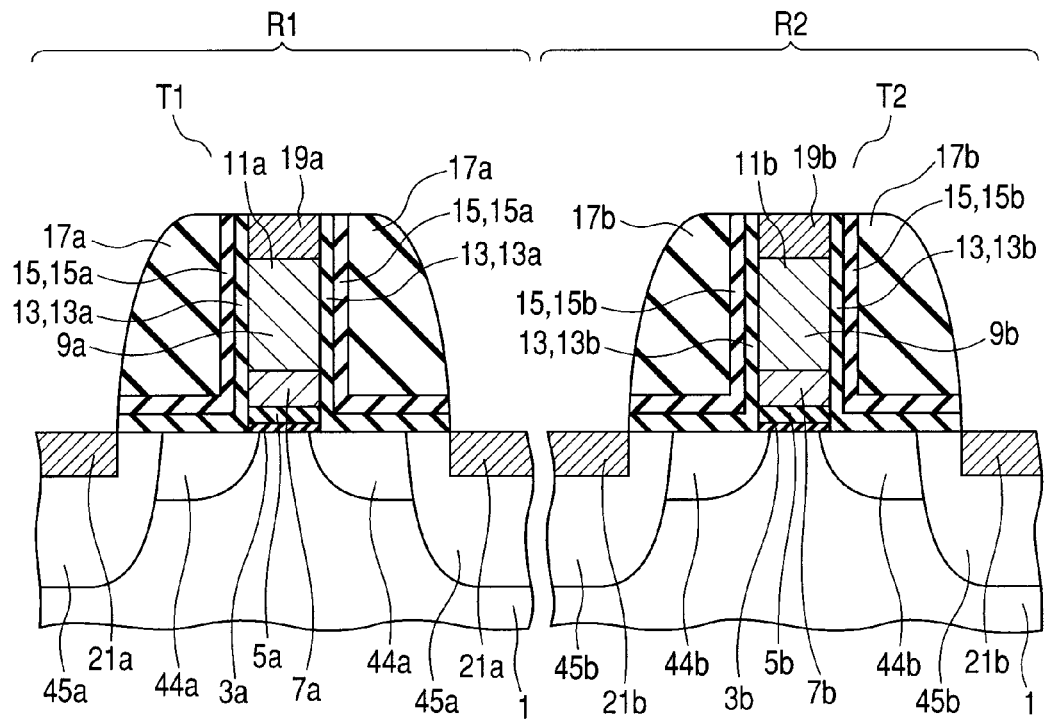
FIG. 21 is a cross-sectional view showing a process performed after the process shown in FIG. 20 in this embodiment.

As shown in FIG. 21, by a salicide process, metal silicide layers 19a and 19b are formed on the surfaces of the polysilicon films 9a and 9b of the gate electrodes 11a and 11b and in surrounding regions thereof, respectively, and metal silicide layers 21a and 21b are formed on the surfaces of the source/drain regions 45a and 45b and in surrounding regions thereof, respectively. At this time, materials for the metal silicide layers 19a, 19b, 21a, and 21b in use include, for example, NiSi, NiPtSi, or the like. In this way, the main parts of the n-channel MOS transistor T1 and the p-channel MOS transistor T2 are formed.

Figure 22:
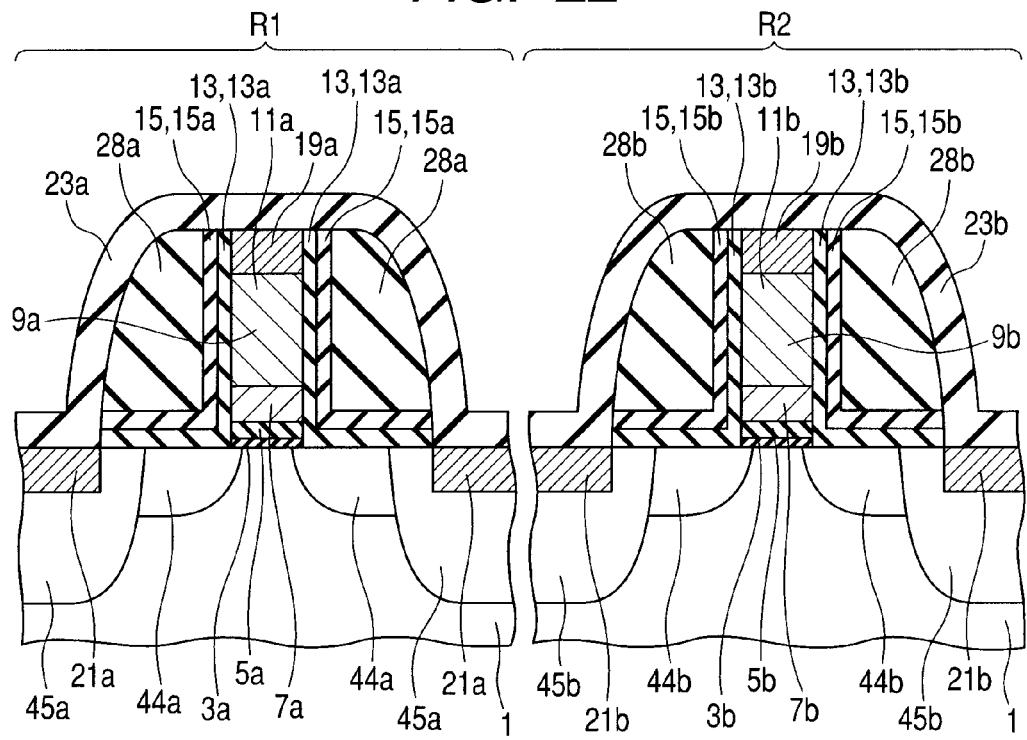
FIG. 22 is a cross-sectional view showing a process performed after the process shown in FIG. 21 in this embodiment.
Figure 23:
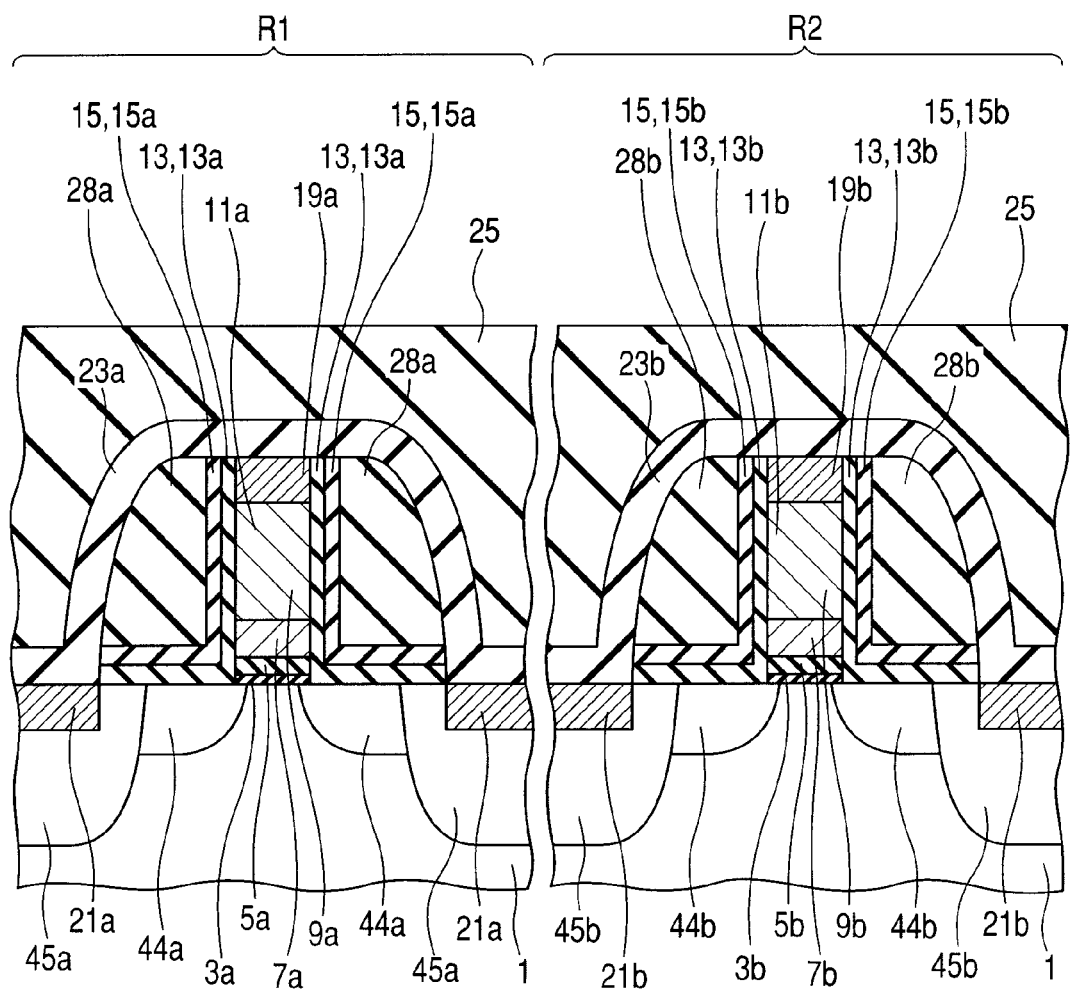
FIG. 23 is a cross-sectional view showing a process performed after the process shown in FIG. 22 in this embodiment.

Then, as shown in FIG. 22, stressor films 23a and 23b comprised of a silicon nitride film with a predetermined stress are formed over the semiconductor substrate 1 so as to cover the MOS transistors T1 and T2. The stressor films 23a and 23b are formed so as to enhance mobility of a carrier by creating local distortion in an area with a channel of the MOS transistor formed therein. Then, as shown in FIG. 23, an interlayer insulating film 25 comprised of a silicon oxide film or the like is formed over the semiconductor substrate 1 so as to cover the stressor films 23a and 23b.

Figure 24:
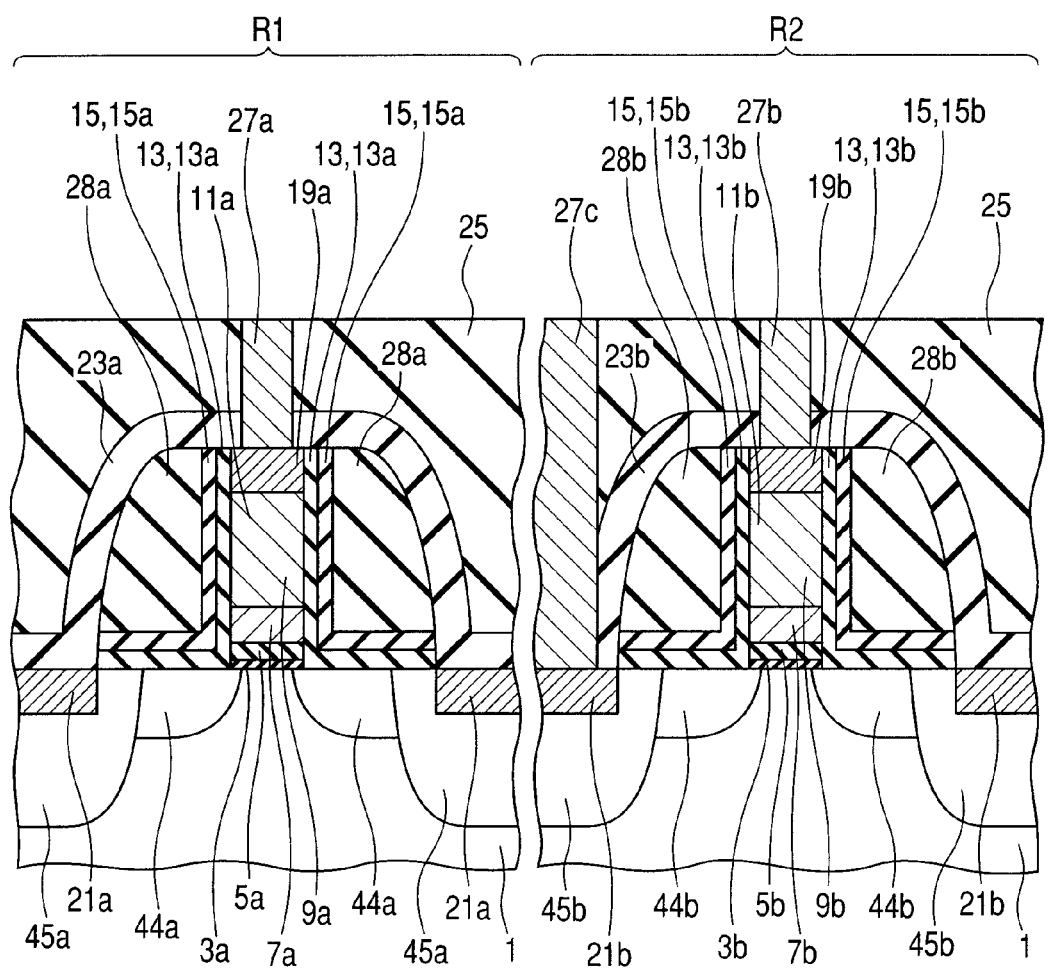
FIG. 24 is a cross-sectional view showing a process performed after the process shown in FIG. 23 in this embodiment.

Then, as shown in FIG. 24, a plug 27a is formed to be electrically coupled to the metal silicide layer 19a of the gate electrode 11a. A plug 27b is formed to be electrically coupled to the metal silicide layer 19b of the gate electrode 11b. A plug 27c is formed to be electrically coupled to the metal silicide layer 21b in the source/drain region 45b.

Figure 25:
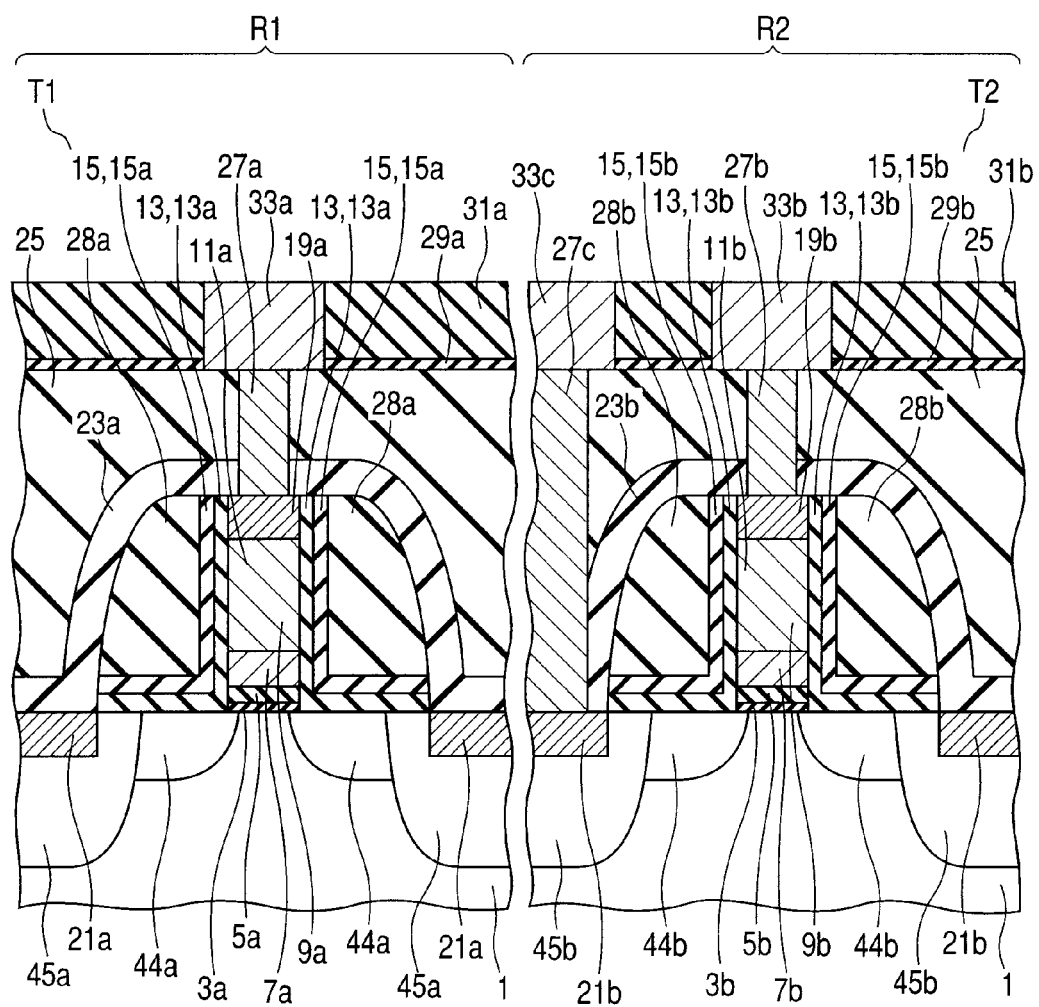
FIG. 25 is a cross-sectional view showing a process performed after the process shown in FIG. 24 in this embodiment.

As shown in FIG. 25, liner films 29a and 29b are formed on the interlayer insulating film 25. Low-k films 31a and 31b having a relatively low dielectric constant are formed on the liner films 29a and 29b, respectively. A wiring slot for exposing the plug 27a is formed in the Low-k film 31a or the like. The Low-k film 31b or the like is provided with a wiring slot for exposing the plug 27b and a wiring slot for exposing the plug 27c. Then, copper wirings 33a, 33b, and 33c are formed in these wiring slots. In this way, the main parts of the semiconductor device are formed.

In the above-mentioned manufacturing method of the semiconductor device, the silicon oxide films 13 and 15 serving as the offset spacer are formed at a temperature condition of about 200° C. in the n(p)-channel MOS transistor by the ALD method, which can prevent the oxidation of the metal films 9a and 9b of the gate electrodes 11a and 11b. Further, the good silicon oxide films 13 and 15 can be formed in which the amount of hydrogen atoms is reduced as compared to the amount of hydrogen atoms in a silicon oxide film formed by a general plasma CVD method.

The thickness of the silicon oxide film can be accurately controlled by changing the number of cycles, so that the relatively thin silicon oxide films 13 and 15 having a thickness of about several nm can be formed with high accuracy. The silicon oxide films 13 and 15 having the desired thickness are formed and the impurity ions are implanted using the silicon oxide films as a mask, whereby the desired extension regions can be surely formed. As a result, the characteristics of the MOS transistor, including current drive capability, can be improved.

In the above-mentioned manufacturing method, by way of example, the silicon oxide films are formed in both of the n-channel MOS transistor and the p-channel MOS transistor as the offset spacer of each MOS transistor. In particular, a silicon nitride film may be formed instead of the silicon oxide film as an offset spacer of the p-channel MOS transistor which is a second layered offset spacer.

In this case, the silicon nitride film can be formed by the thermal CVD method, for example, by reacting dichlorosilane ($SiH_2Cl_2$) with ammonia ($NH_3$), by reacting hexachlorodisilane (HCD) with ammonia ($NH_3$), or by reacting monosilane with ammonia ($NH_3$).

The device for forming the silicon oxide films 13 and 15 is the parallel-plate type plasma CVD device by way of example, but is not limited to the plasma CVD device as long as the device can achieve the steps 1 to 3.

Third Embodiment

Figure 26:
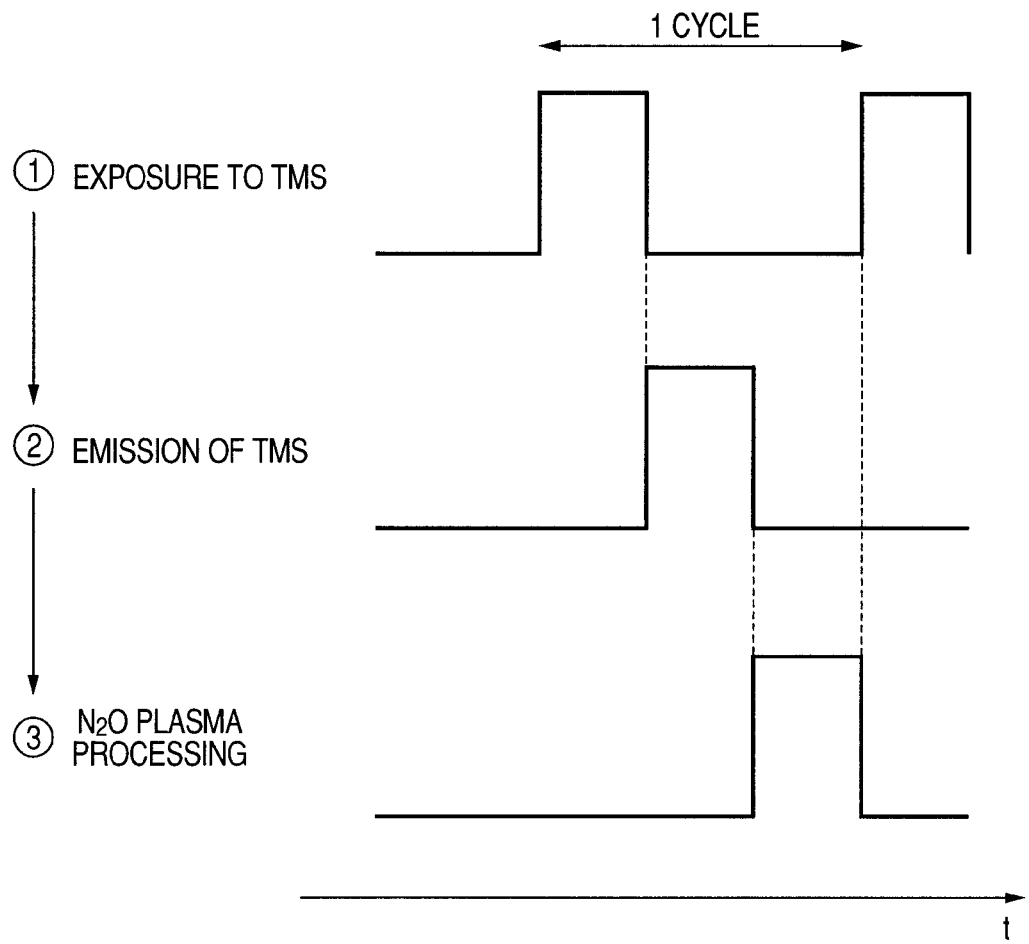
FIG. 26 is a diagram showing respective steps in a manufacturing method of a semiconductor device according to a third embodiment of the invention.

The following will describe a manufacturing method for forming a silicon oxide (SiCO) film to which carbon is added under low temperature using the general parallel-plate type plasma CVD device. As shown in FIG. 26, the silicon oxide film with carbon added is formed by repeating one cycle including three steps a predetermined number of times. First, in step 1, a semiconductor substrate is exposed to trimethylsilane ($Si(CH_3)_3H$, hereinafter referred to as "TMS"). Then, in step 2, the remaining trimethylsilane (TMS) is emitted or exhausted. And in step 3, the semiconductor substrate is exposed to nitrous oxide plasma.

Figure 27:
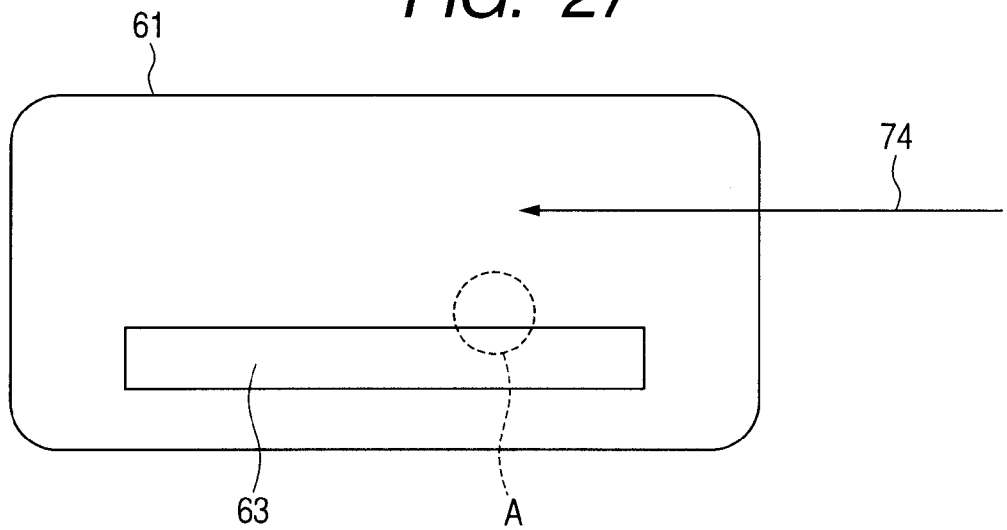
FIG. 27 is a cross-sectional view showing a process in step 1 in this embodiment.
Figure 28:
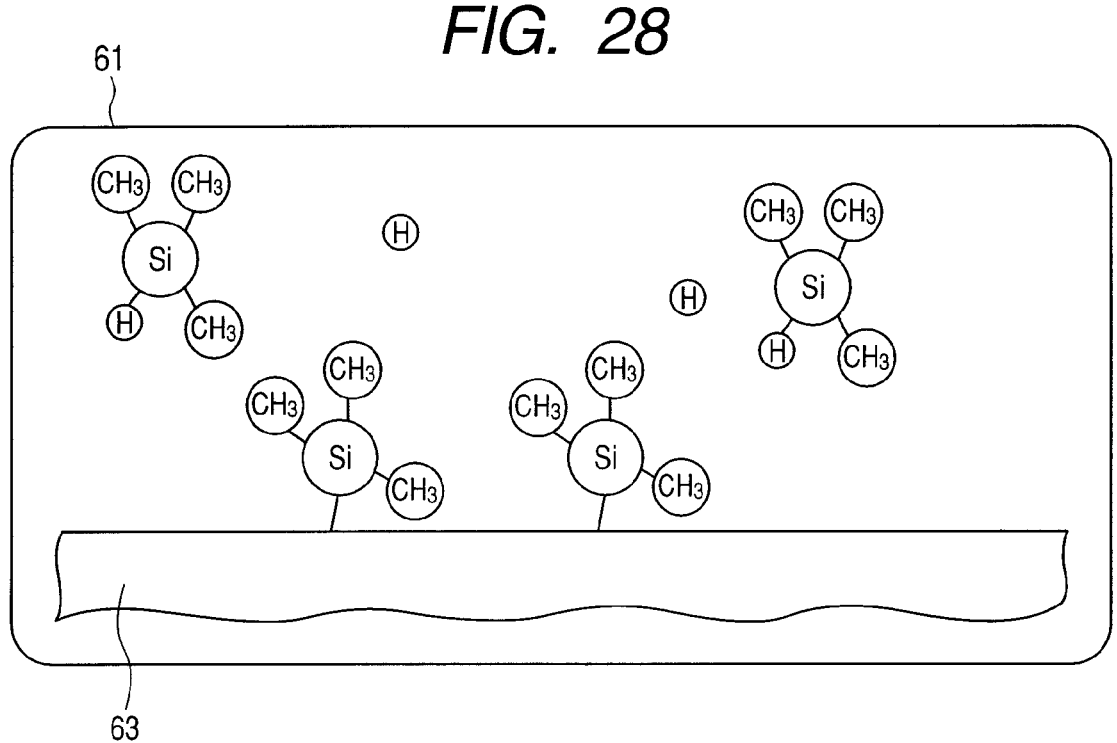
FIG. 28 is a partially enlarged cross-sectional view showing the state of a surface of a semiconductor substrate in step 1 in this embodiment.

Each step will be described below in more detail. As shown in FIG. 27, first, the semiconductor substrate 63 is carried into the chamber 61 of the plasma CVD device. In step 1, the temperature of the heater provided in the chamber 61 is set to about 200° C. Trimethylsilane (TMS) diluted with nitrous oxide ($N_2O$) and helium (He) is introduced into the chamber 61 as a carrier gas (as indicated by the arrow 74), so that the semiconductor substrate 63 is exposed to the trimethylsilane (TMS) for about 2 to 10 seconds. At this time, as shown in FIG. 28, the trimethylsilane (TMS) is bonded to a dangling bond of an underlayer (semiconductor substrate 63), and thus is adsorbed to the underlayer (semiconductor substrate 63). FIG. 28 shows an enlarged part enclosed by the circle A shown in FIG. 27.

As one example of the gas flow rate ratio, the gas flow rate ratio of, for example, TMS:$N_2O$:He is 1:30:300. In particular, the flow rate of He is set to about 300 to 500 relative to the flow rate of the trimethylsilane (TMS) of 1, so that the trimethylsilane (TMS) can be uniformly diffused into the chamber 61.

Figure 29:
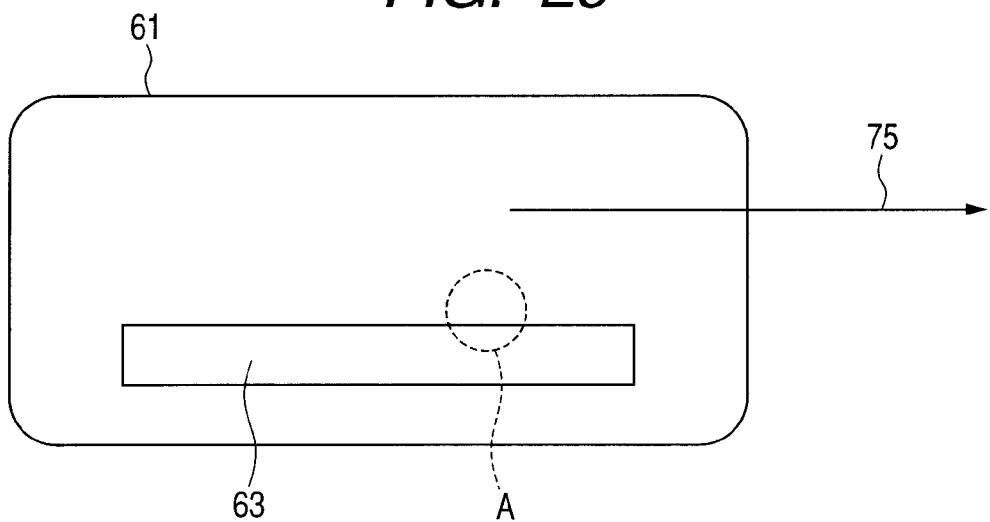
FIG. 29 is a cross-sectional view showing a process in step 2 in this embodiment.
Figure 30:
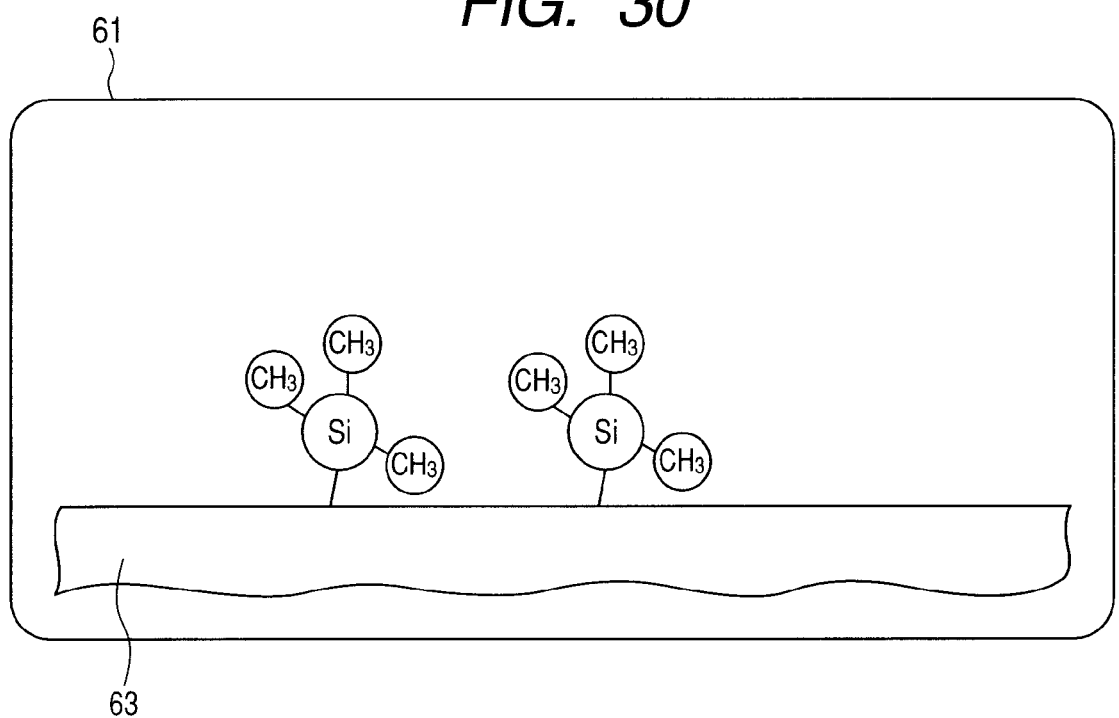
FIG. 30 is a partially enlarged cross-sectional view showing the state of a surface of a semiconductor substrate in step 2 in this embodiment.

Then, in step 2, as shown in FIG. 29, the trimethylsilane (TMS) remaining in the chamber 61 is sent to the outside of the chamber 61 by evacuating the chamber 61 for about 1 to 5 seconds (as indicated by the arrow 75). At this time, as shown in FIG. 30, the trimethylsilane (TMS) adsorbed to the underlayer (semiconductor substrate 63) remains as it is without being emitted or exhausted. FIG. 30 shows an enlarged part enclosed by the circle A shown in FIG. 29. In step 2, the helium (He) and the nitrous oxide ($N_2O$) may continue to be introduced into the chamber 61 without being emitted.

Figure 31:
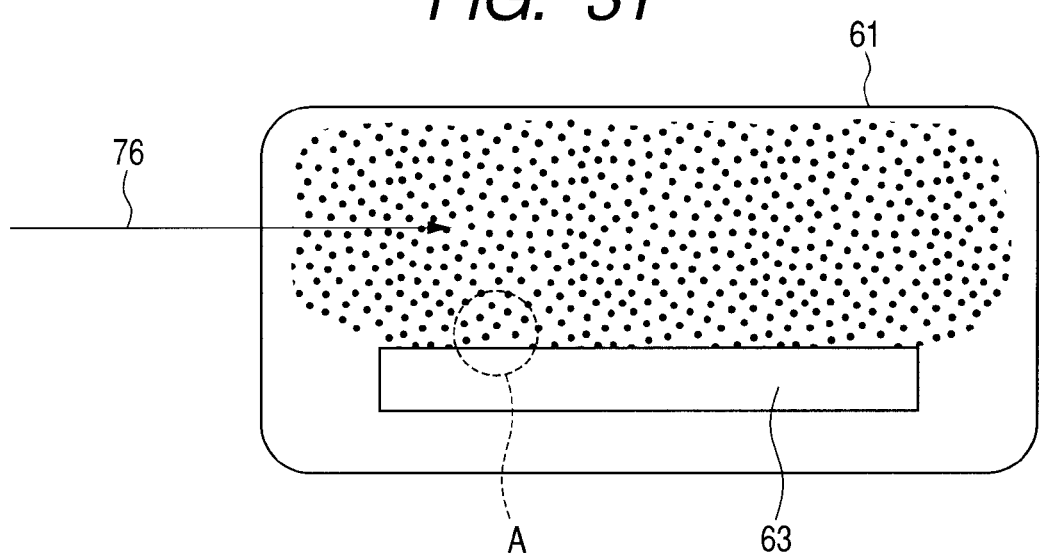
FIG. 31 is a cross-sectional view showing a process in step 3 in this embodiment.

Then, in step 3, as shown in FIG. 31, the nitrous oxide ($N_2O$) and the helium (He) are introduced (as indicated by the arrow 76) into the chamber 61 to generate nitrous oxide plasma, and the semiconductor substrate 63 is exposed to the nitrous oxide plasma for about 10 seconds. At this time, as one example of the gas flow ratio, for example, the ratio of the flow rate of He to $N_2O$ of 1 is set to about 5 to 10. A RF power is set to, for example, 0.1 to 1 W/cm$^2$.

Figure 32:
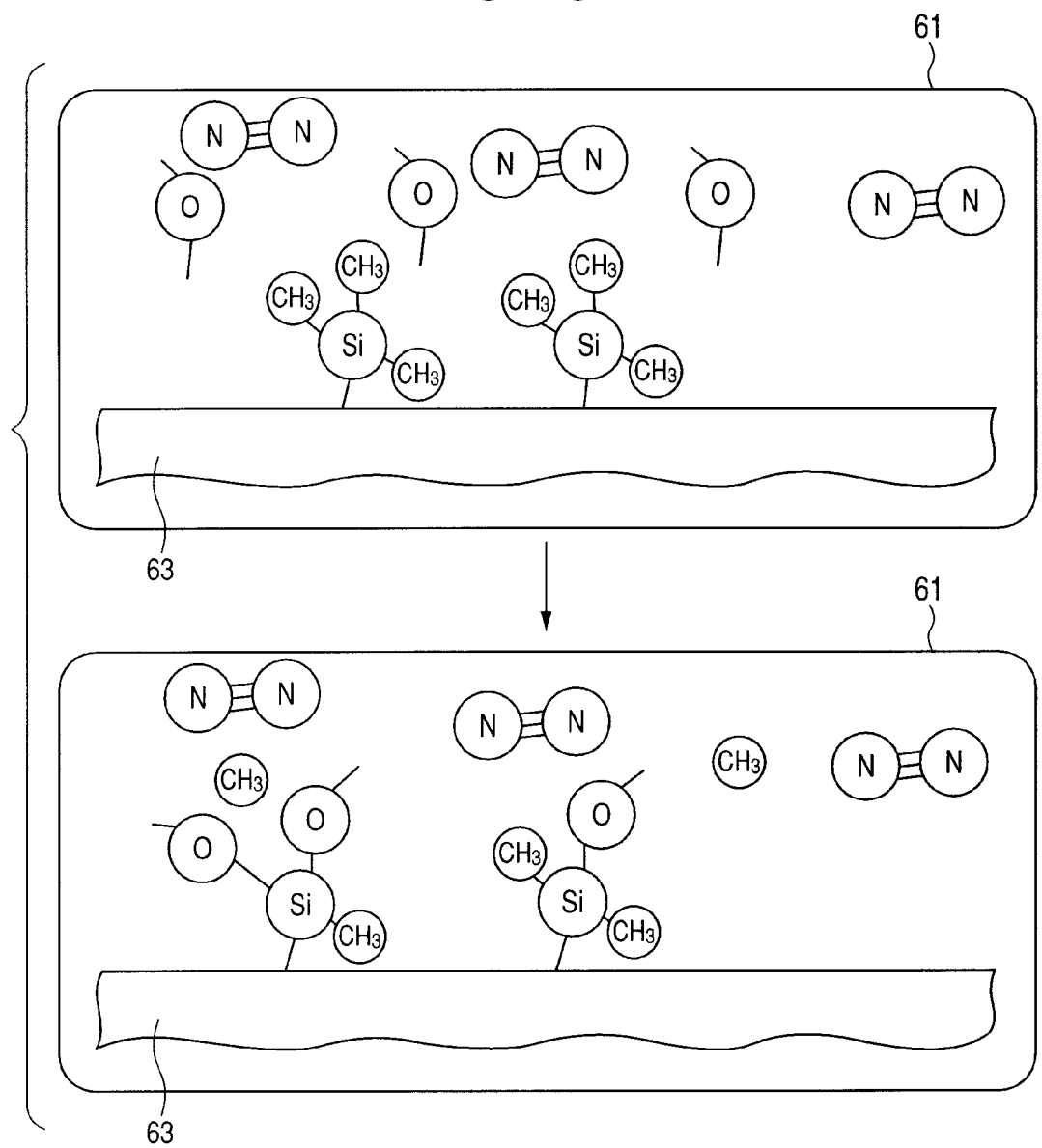
FIG. 32 is a partially enlarged cross-sectional view showing the state of a surface of a semiconductor substrate in step 3 in this embodiment.

As shown in FIG. 32, the nitrous oxide is decomposed into nitrogen ($N_2$) and oxygen atoms (O) by the nitrous oxide plasma. A hydrogen atom (H) or methyl group ($CH_3$) of the trimethylsilane (TMS) adsorbed to the underlayer (semiconductor substrate 63) is substituted by the oxygen atom (O) to form a single SiCO layer. FIG. 32 shows an enlarged part enclosed by the circle A shown in FIG. 31.

The silicon oxide film with the desired carbon added is formed by repeating one cycle including steps 1 to 3 until a necessary thickness of the film is obtained. The semiconductor substrate 63 provided with the silicon oxide film to which the desired carbon is added is taken out of the chamber 61.

In the above manufacturing method, a single molecular layer of trimethylsilane (TMS) is formed every cycle, and then the single molecular layer is oxidized to form each silicon oxide film with carbon added. Thus, the thickness of the silicon oxide film can be accurately controlled by changing the number of cycles.

When the trimethylsilane (TMS) adsorbed to the underlayer (semiconductor substrate 63) is oxidized by the nitrous oxide plasma, the hydrogen atom (H) of the trimethylsilane (TMS) or the like can be removed in the form of water ($H_2O$) by an oxygen (O) radical, which results in reduction in amount of hydrogen atoms (H) contained in the silicon oxide film with carbon added. Thus, the good silicon oxide film with carbon added can be formed.

Further, such a good silicon oxide film with carbon added can be formed at a relatively low temperature of about 200° C. For example, the silicon oxide film with carbon added is formed as the offset spacer of the MOS transistor including the gate electrode formed using the High-k film and metal film, which can prevent the oxidation of the metal film of the gate electrode. As a result, the characteristics of the MOS transistor, including current drive capability, can be improved.

In the above-mentioned manufacturing method, a supply source (precursor) of carbon is trimethylsilane (TMS) by way of example. However, tetramethylsilane ($Si(CH_3)_4$ hereinafter referred to as a "4MS"), in addition to the trimethylsilane (TMS), can also be used as the carbon supply source. The above conditions, regarding a gas flow rate ratio relative to other carrier gases, in application of the tetramethylsilane (4MS) are substantially set to the same ones as those in application of the trimethylsilane (TMS).

Fourth Embodiment

The following will describe a case where the above forming method of the silicon oxide film with carbon added is applied to formation of the offset spacer of the MOS transistor.

Figure 33:
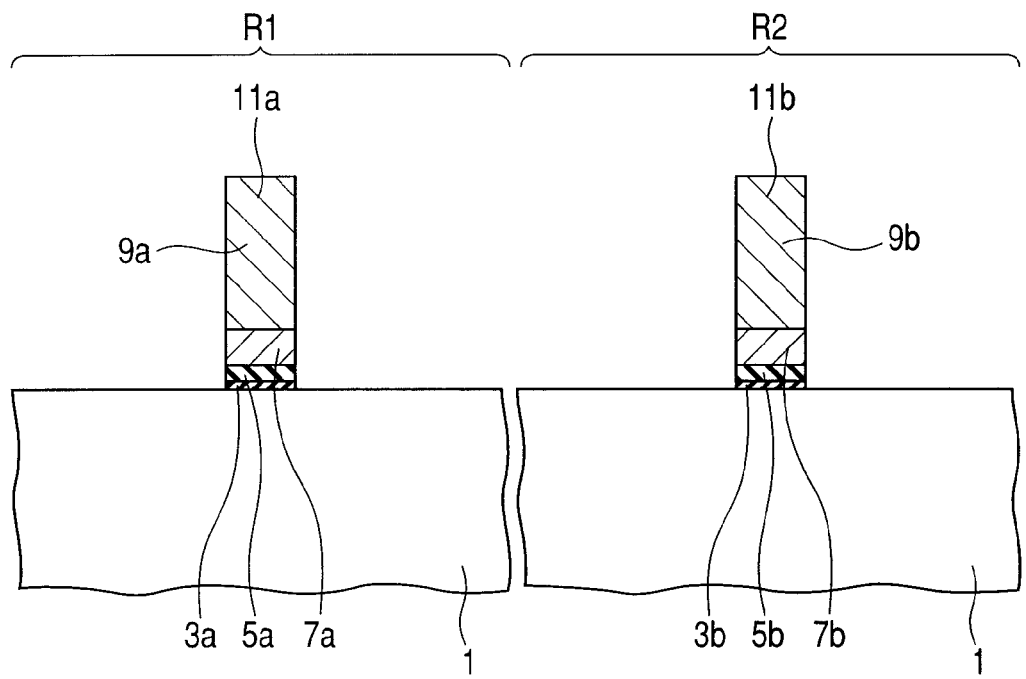
FIG. 33 is a cross-sectional view showing one process in a manufacturing method of a semiconductor device according to a fourth embodiment of the invention.

As shown in FIG. 33, through the same process as that shown in FIG. 10, the gate electrode 11a of the n-channel MOS transistor is formed in the nMOS region R1 over the semiconductor substrate 1 in such a manner as to laminate the High-k film 5a having a predetermined dielectric constant, the metal film 7a having a predetermined work function, and the polysilicon film 9a in that order on the interlayer 3a. On the other hand, in the pMOS region R2 over the semiconductor substrate 1, the gate electrode 11b of the p-channel MOS transistor is formed in such a manner as to laminate the High-k film 5b having a predetermined dielectric constant, the metal film 7b having a predetermined work function, and the polysilicon film 9b in that order on the interlayer 3b.

Figure 34:
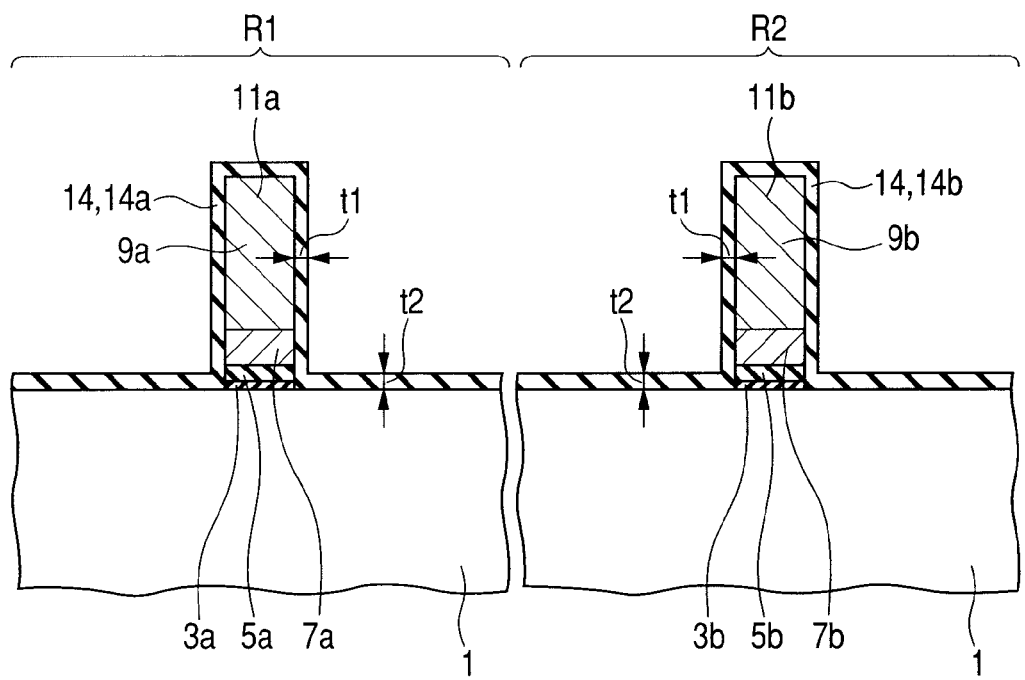
FIG. 34 is a cross-sectional view showing a process performed after the process shown in FIG. 33 in this embodiment.

Then, as shown in FIG. 34, the silicon oxide film 14 of about several nm in thickness with carbon added is formed over the semiconductor substrate 1 so as to cover the gate electrodes 11a and 11b. At this time, the silicon oxide film 14 with carbon added is formed by the above-mentioned forming method.

Figure 35:
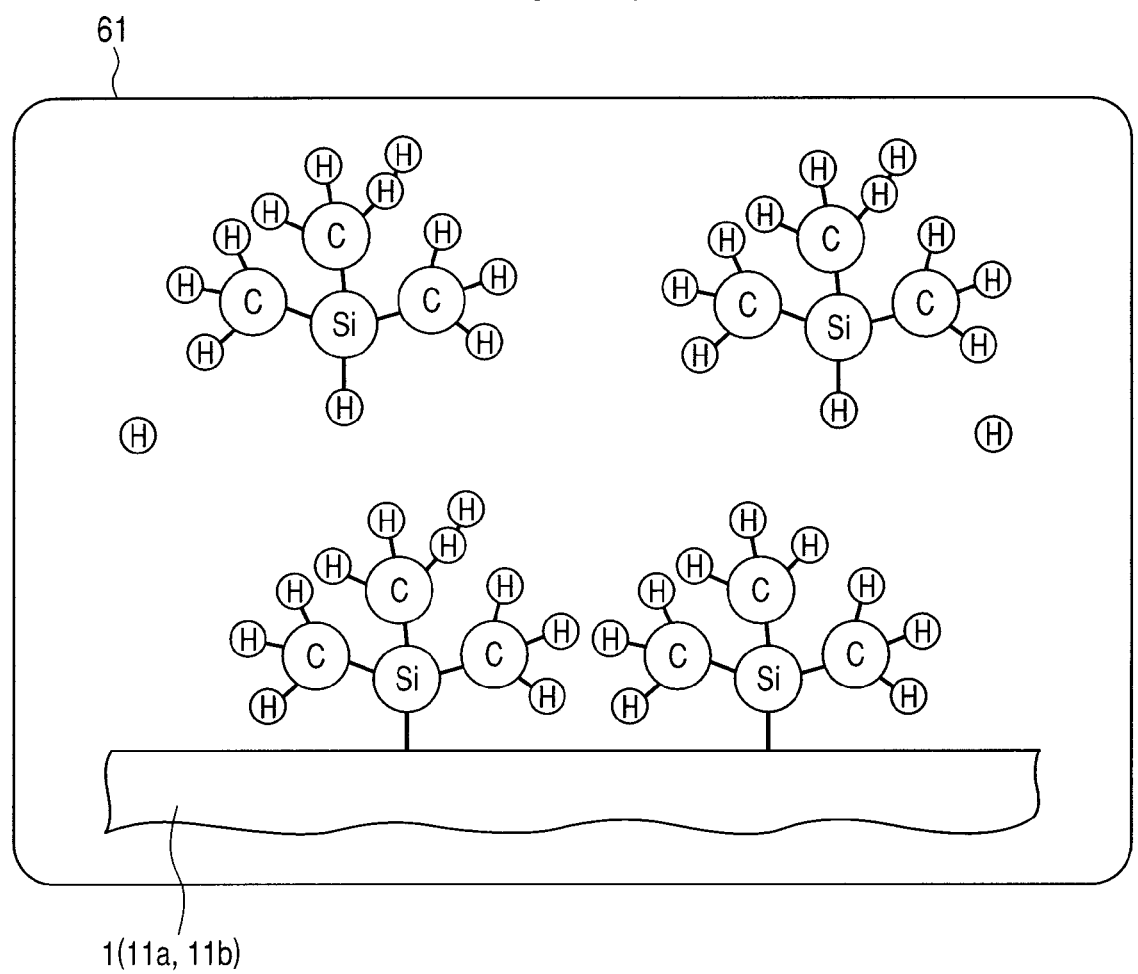
FIG. 35 is a partially enlarged cross-sectional view showing the state of a surface of a semiconductor substrate in step 1 of the process shown in FIG. 34 in this embodiment.

As shown in FIG. 35, the semiconductor substrate 1 having the gate electrodes 11a and 11b formed thereover is carried into, for example, the chamber 61 of the parallel-plate type plasma CVD device. The temperature of the heater (not shown) in the chamber 61 is set to about 200° C. Trimethylsilane (TMS) as a precursor of carbon diluted with nitrous oxide ($N_2O$) and helium (He) is introduced into the chamber 61 as a carrier gas, so that the semiconductor substrate 1 is exposed to the trimethylsilane (TMS) for about 2 to 10 seconds (in step 1).

At this time, the trimethylsilane (TMS) is bonded to a dangling bond of the surface of the semiconductor substrate 1 (gate electrodes 11a and 11b), and thus is adsorbed to the semiconductor substrate 1. As mentioned above, the flow rates of respective gases are controlled and set at a predetermined flow rate ratio, so that the trimethylsilane (TMS) can be uniformly diffused into the chamber 61.

Figure 36:
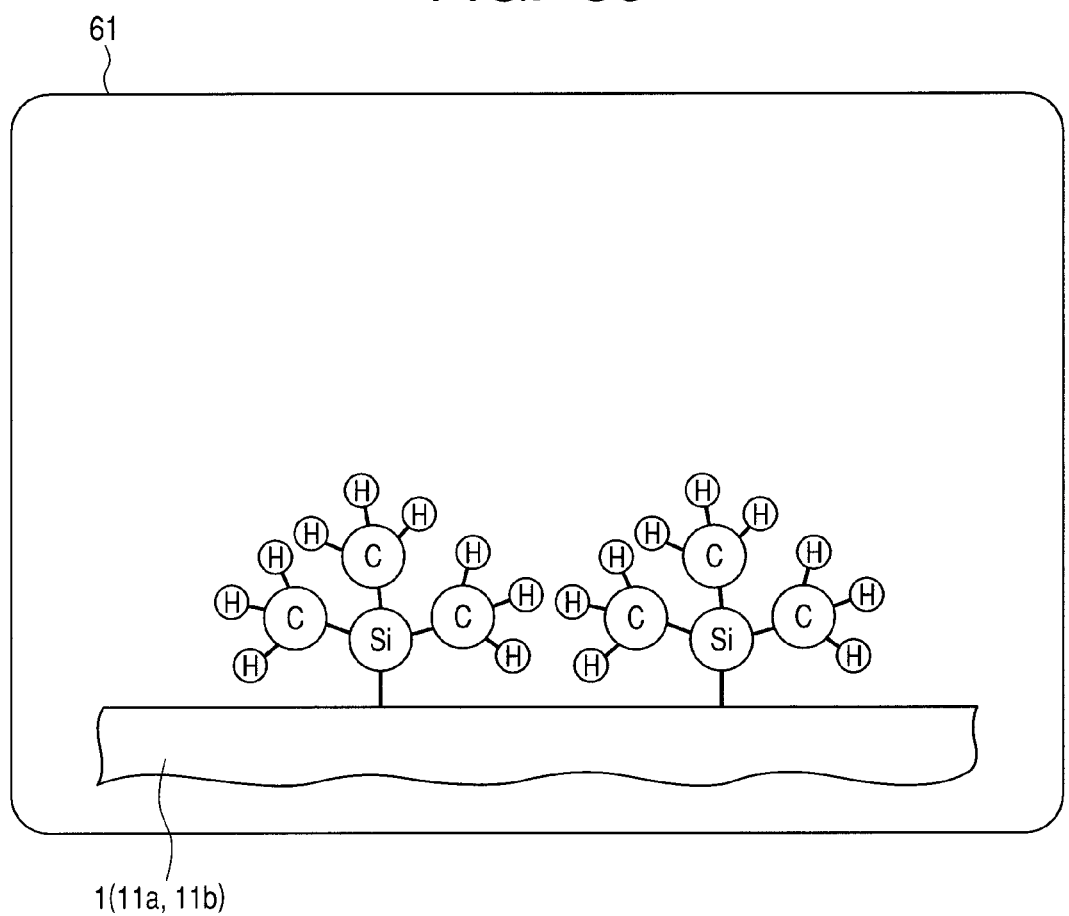
FIG. 36 is a partially enlarged cross-sectional view showing the state of a surface of a semiconductor substrate in step 2 of the process shown in FIG. 34 in this embodiment.

Then, as shown in FIG. 36, the trimethylsilane (TMS) or the like remaining in the chamber 61 is sent to the outside of the chamber 61 by evacuating the chamber 61 for about 1 to 5 seconds (in step 2). At this time, the trimethylsilane (TMS) adsorbed to the semiconductor substrate 1 remains as it is without being emitted. In step 2, helium (He) and nitrous oxide ($N_2O$) may continue to be introduced into the chamber 61 without being emitted.

Figure 37:
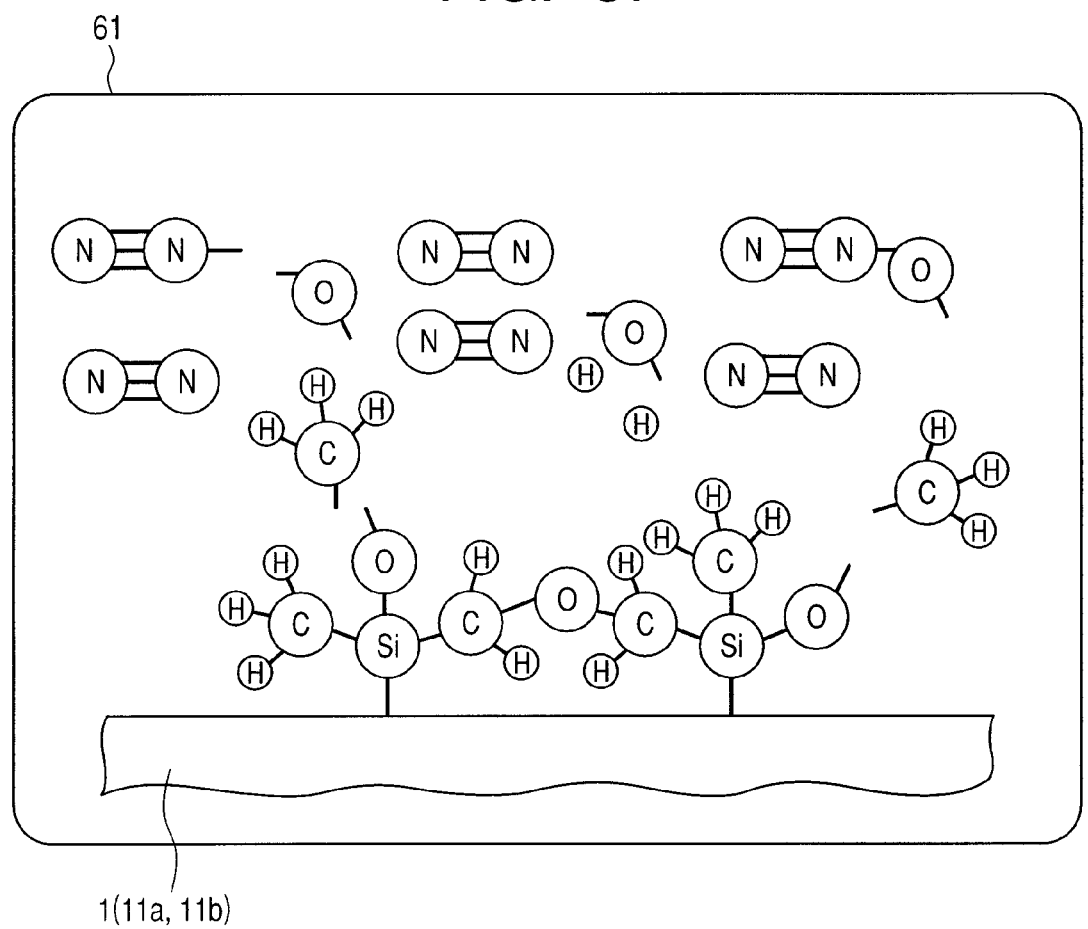
FIG. 37 is a partially enlarged cross-sectional view showing the state of a surface of a semiconductor substrate in step 3 of the process shown in FIG. 34 in this embodiment.

Then, as shown in FIG. 37, nitrous oxide ($N_2O$) and helium (He) are introduced into the chamber 61 to form nitrous oxide plasma. The semiconductor substrate 1 was exposed to the nitrous oxide plasma for about 10 seconds (step 3). The above-mentioned conditions, regarding the flow rate rates of the respective gases, and RF powers, are adopted. The nitrous oxide is decomposed into nitrogen ($N_2$) and oxygen atoms (O) by the nitrous oxide plasma. A hydrogen atom (H) or a methyl group ($CH_3$) of the trimethylsilane (TMS) adsorbed to the semiconductor substrate 1 is substituted by the oxygen atom (O) to form a single SiCO layer.

The silicon oxide film 14 of a desired thickness with carbon added (see FIG. 34) is formed over the semiconductor substrate 1 so as to cover the gate electrodes 11a and 11b by repeating one cycle comprised of steps 1 to 3 until a necessary thickness of the film is obtained. At this time, a thickness t1 of a part of the silicon oxide film 14 containing added carbon and covering the sides of the gate electrodes 11a and 11b is smaller than a thickness t2 of a part of the film 14 covering the upper surface of the semiconductor substrate 1. The part of the silicon oxide film 14 containing added carbon and covering the sides of the gate electrodes 11a and 11b is more thinned, which can enhance the controllability of implantation of an extension region, and further can advantageously fill a gap between the gate electrodes in the following process. In contrast, the part of the silicon oxide film 14 containing added carbon and covering the upper surface of the semiconductor substrate 1 is more thickened, which can reduce damage in implantation of the extension region. Among the thus-formed silicon oxide film 14 with carbon added, the part containing added carbon and covering the gate electrode 11a is referred to as a silicon oxide film 14a, and the part containing added carbon and covering the gate electrode 11b is referred to as a silicon oxide film 14b.

Figure 38:
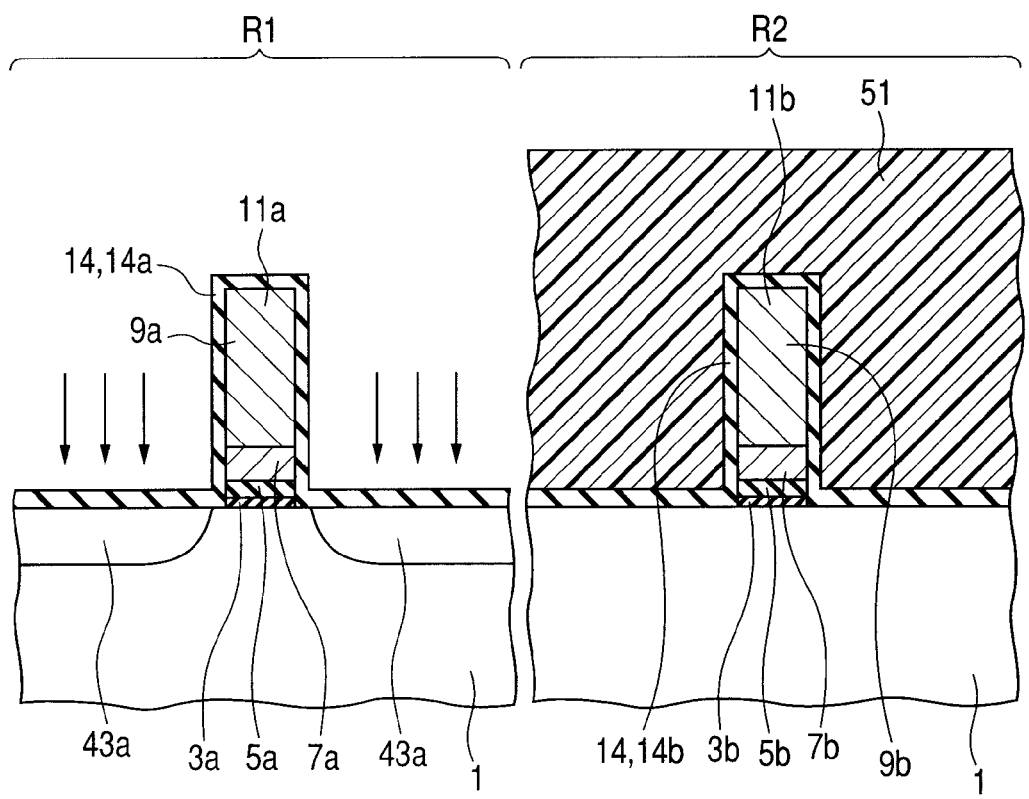
FIG. 38 is a cross-sectional view showing a process performed after the process shown in FIG. 34 in this embodiment.

Then, as shown in FIG. 38, the resist pattern 51 is formed in such a manner as to expose the nMOS region R1, while covering the pMOS region R2. In the nMOS R1, the part of the silicon oxide film 14a positioned on the sides of the gate electrode 11a among the silicon oxide film 14a serves as the offset spacer. Then, n-type impurity ions, such as arsenic (As) or phosphorus (P), are implanted (as indicated by the arrow) using the offset spacer or the like comprised of the part of the silicon oxide film 14a as a mask thereby to form n-type extension implantation regions 43a in a predetermined depth from the surface of the semiconductor substrate 1. Thereafter, an ashing process is applied to the semiconductor substrate in an oxygen plasma atmosphere thereby to remove the resist pattern 51.

Figure 39:
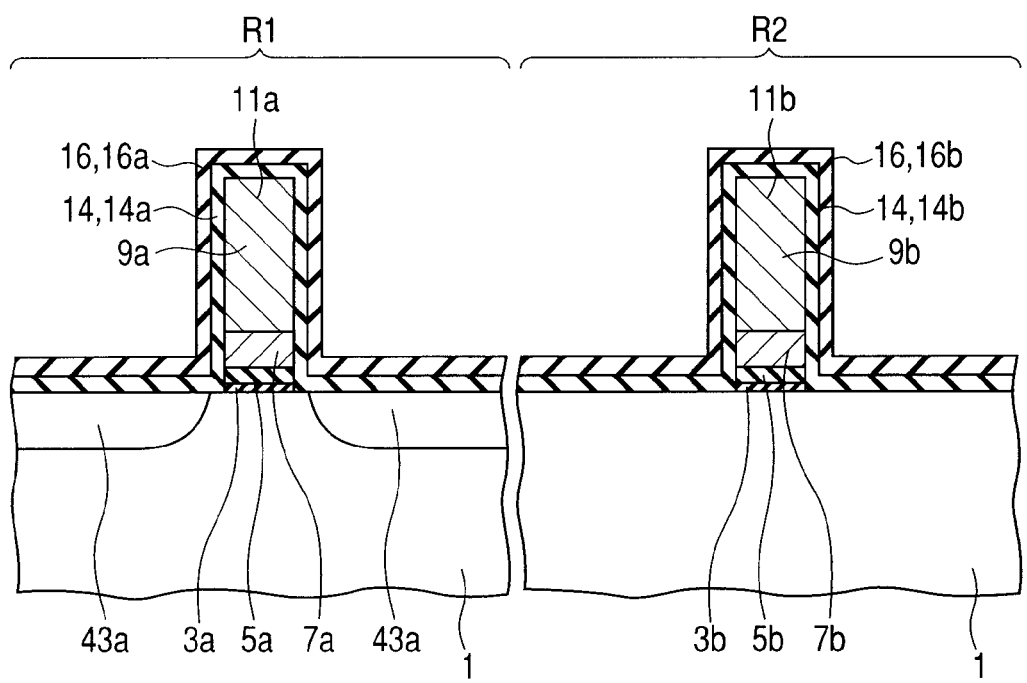
FIG. 39 is a cross-sectional view showing a process performed after the process shown in FIG. 38 in this embodiment.

Then, as shown in FIG. 39, a silicon oxide film 16 with carbon added is formed so as to cover the silicon oxide film 14 with carbon added. The silicon oxide film 16 with carbon added is also preferably formed by the above-mentioned forming method. In the same way as the case where the silicon oxide film 14 with carbon added is formed, the silicon oxide film 16 of a desired thickness with carbon added is formed by repeating one cycle including steps 1 to 3 until a necessary thickness of the film is obtained. At this time, like the silicon oxide film 14 with carbon added, the thickness of a part of a silicon oxide film 16 containing added carbon and covering the sides of the gate electrodes 11a and 11b is smaller than that of a part of the film 16 covering the upper surface of the semiconductor substrate 1. This structure can improve the controllability of implantation and the filling property of the gap between the gate electrodes, while reducing the damage in implantation. Among the thus-formed silicon oxide film 16, the silicon oxide film covering the gate electrode 11a is referred to as a silicon oxide film 16a, and the silicon oxide film covering the gate electrode 11b is referred to as a silicon oxide film 16b.

Figure 40:
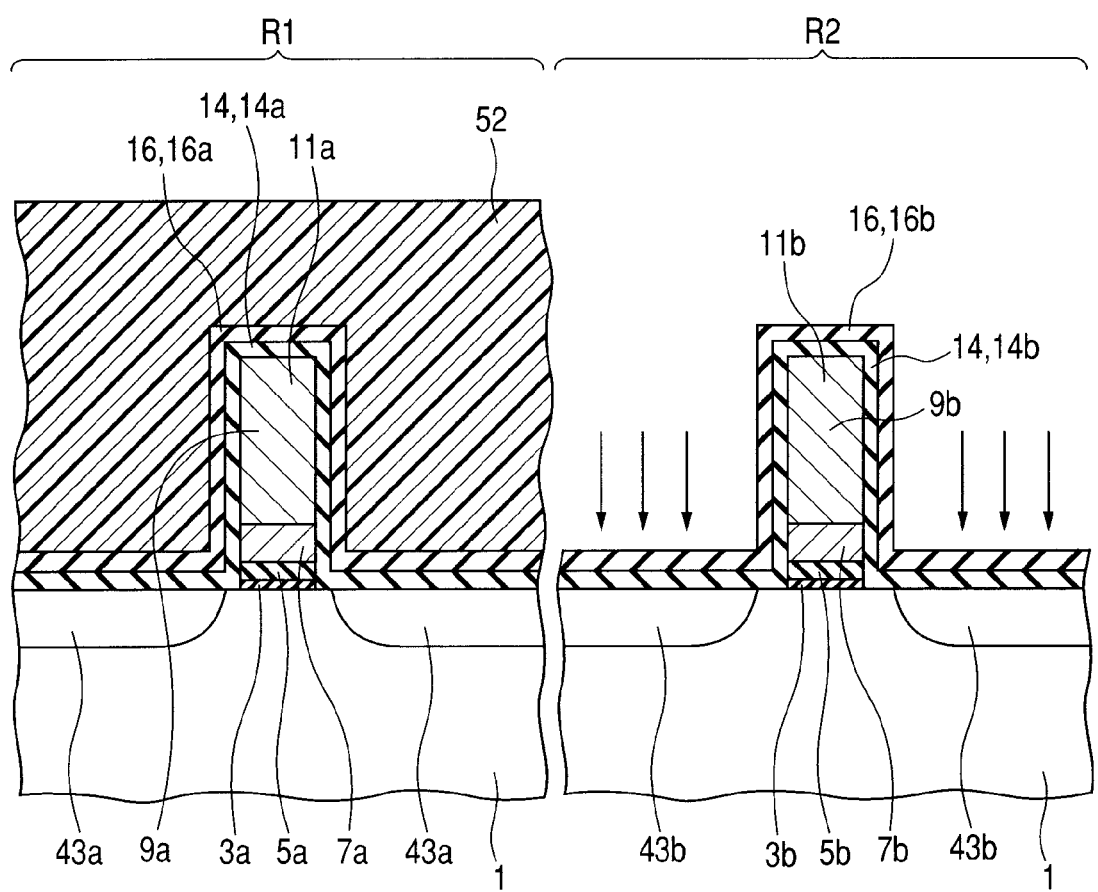
FIG. 40 is a cross-sectional view showing a process performed after the process shown in FIG. 39 in this embodiment.

Then, as shown in FIG. 40, a resist pattern 52 is formed in such a manner as to cover the nMOS region R1, while exposing the pMOS region R2. In the pMOS region R2, among the silicon oxide films 14b and 16b with carbon added, the part of the silicon oxide films 14b and 16b containing added carbon and positioned on the sides of the gate electrode 11b serve as the offset spacer.

Then, p-type impurity ions, such as boron fluoride ($BF_2$), boron (B), or indium (In), are implanted (as indicated by the arrow), using the offset spacer or the like comprised of the part of the silicon oxide films 14b and 16b with carbon added as a mask thereby to form p-type extension implantation regions 43b in a predetermined depth from the surface of the semiconductor substrate 1. Thereafter, an ashing process is applied to the semiconductor substrate in an oxygen plasma atmosphere thereby to remove the resist pattern 52.

Figure 41:
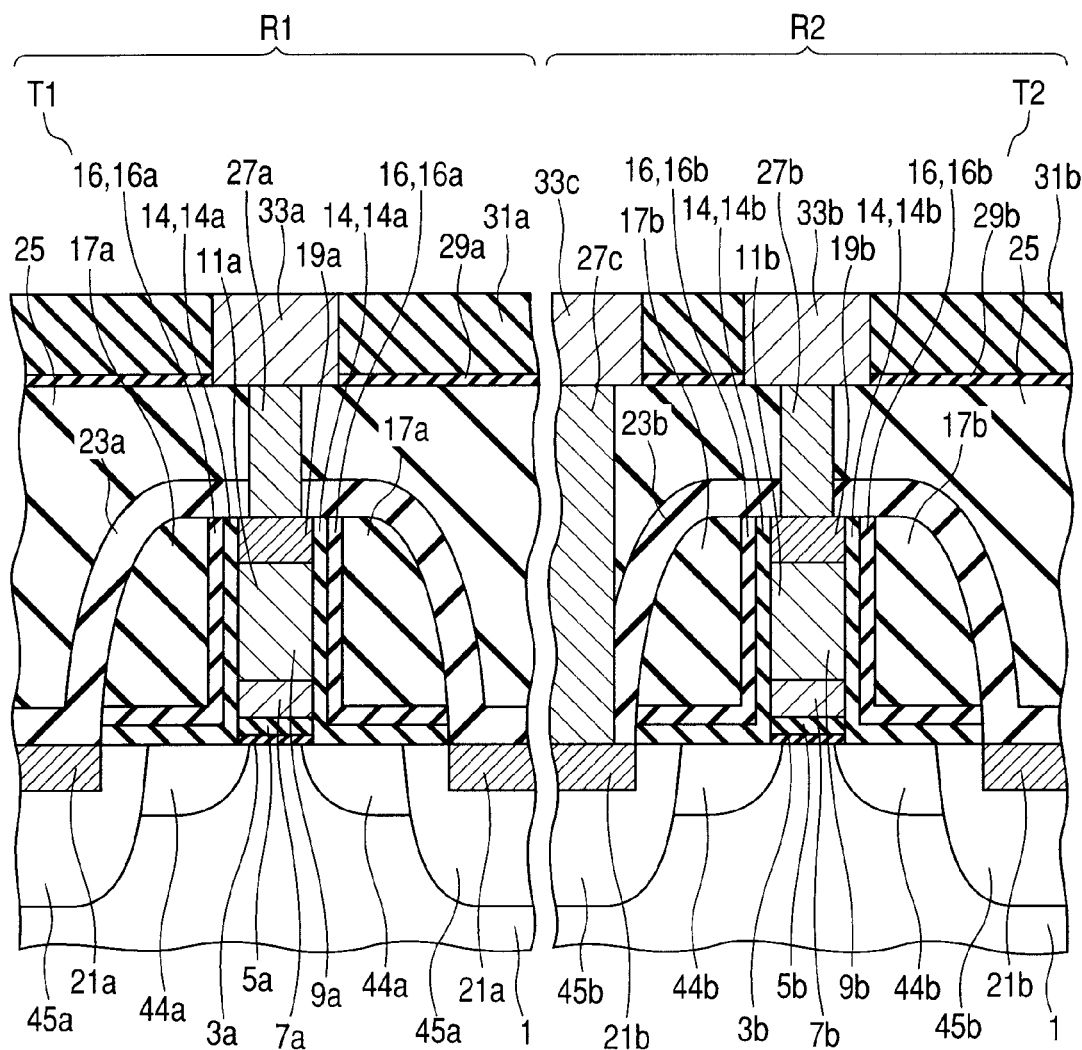
FIG. 41 is a cross-sectional view showing a process performed after the process shown in FIG. 40 in this embodiment.

Then, the sidewall insulating films 17a are formed on the sides of the gate electrode 11a, and the sidewall insulating films 17b are formed on the sides of the gate electrode 11b, through the same processes as those shown in FIGS. 18 and 19 (see FIG. 41). Then, extension regions 44a, and source/drain regions 45a are formed in the nMOS region R1 through the same process as that shown in FIG. 20. On the other hand, extension regions 44b, and source/drain regions 45b are formed in the pMOS region R2 (see FIG. 41).

Then, through the same process as that shown in FIG. 21, metal silicide layers 19a and 19b are formed on the surfaces of the polysilicon films 9a and 9b of the gate electrodes 11a and 11b and in surrounding regions thereof, respectively, and metal silicide layers 21a and 21b are formed on the surfaces of the source/drain regions 45a and 45b and in surrounding regions thereof (see FIG. 41). Then, through the same process as that shown in FIG. 22, stressor films 23a and 23b comprised of a silicon nitride film with a predetermined stress are formed over the semiconductor substrate 1 so as to cover the MOS transistors T1 and T2 (see FIG. 41).

Then, through the same process as that shown in FIG. 23, an interlayer insulating film 25 comprised of a silicon oxide film or the like is formed over the semiconductor substrate 1 so as to cover the stressor films 23a and 23b (see FIG. 41). Then, through the same process as that shown in FIG. 24, a plug 27a is formed to be electrically coupled to the metal silicide layer 19a of the gate electrode 11a. A plug 27b is formed to be electrically coupled to the metal silicide layer 19b of the gate electrode 11b. A plug 27c is formed to be electrically coupled to the metal silicide layer 21b in the source/drain region 45b (see FIG. 41).

Then, through the same process as that shown in FIG. 25, liner films 29a and 29b are formed on the interlayer insulating film 25. Low-k films 31a and 31b having a relatively low dielectric constant are formed on the liner films 29a and 29b, respectively. A wiring slot for exposing the plug 27a is formed in the Low-k film 31a. The Low-k film 31b or the like is provided with a wiring slot for exposing the plug 27b and a wiring slot for exposing the plug 27c. Then, copper wirings 33a, 33b, and 33c are formed in these wiring slots. In this way, the main parts of the semiconductor device are formed as shown in FIG. 41.

In the above-mentioned manufacturing method of the semiconductor device, the silicon oxide films 14 and 16 containing added carbon and serving as the offset spacer are formed under a temperature condition of about 200° C. in the n(p) channel MOS transistor by the ALD method, which can prevent the oxidization of the metal films 9a and 9b of the gate electrodes 11a and 11b. Further, the good silicon oxide films 13 and 15 with carbon added can be formed in which the amount of hydrogen atoms is reduced as compared to the amount of hydrogen atoms in a silicon oxide film containing added carbon and formed by a general plasma CVD method.

Moreover, the thickness of the silicon oxide film with carbon added can be accurately controlled by changing the number of cycles. As a result, the silicon oxide films 14 and 16 containing added carbon, and having a relatively small thickness of about several nm can be formed with high accuracy. The formation of the silicon oxide films 14 and 16 of the desired thickness with carbon added can surely form the desired extension regions by implanting impurity ions using the silicon oxide film as a mask.

The silicon oxide film (SiOC film) with carbon added has a low dielectric constant with respect to the same thickness as compared to that of the above-mentioned silicon oxide film (SiO film). Such silicon oxide films 14 and 15 with carbon added are formed as an offset spacer at the gate electrodes 11a and 11b of the MOS transistors T1 and T2, so that a fringe capacity between the gate electrodes 11a and 11b and the source/drain regions 45a and 45b can be reduced. As a result, the characteristics of the MOS transistor, including current drive capability, can be improved.

In the above manufacturing method, the silicon oxide film with carbon added is formed, by way of example, as the offset spacer of the MOS transistor both in the n-channel MOS transistor and the p-channel MOS transistor. Particularly, a silicon nitride film may be formed instead of the silicon oxide film with carbon added, as the offset spacer of the p-channel MOS transistor which is a second layered offset spacer as mentioned above.

Although the parallel-plate type plasma CVD device has been described, by way of example, as the device for forming the silicon oxide films 14 and 16 with carbon added, the invention is not limited to the plasma CVD device as long as the device can achieve steps 1 to 3.

The preferred embodiments disclosed herein are illustrated by way of example only, and not limitation. It is intended that the scope of the present invention be limited not by this detailed description, but rather by the claims appended thereto, and that the present invention covers all modifications falling within the sprit and scope of the claims and their equivalents.

The invention is effectively used as an offset spacer of a gate electrode comprised of a laminated structure of a High-k film and a metal film.

What is claimed is:

1. A manufacturing method of a semiconductor device, comprising the steps of:
   forming a gate electrode in a predetermined region of a main surface of a semiconductor substrate in such a manner as to laminate a metal film having a predetermined work function over a dielectric film having a predetermined dielectric constant;
   forming a predetermined offset insulating film so as to cover a side of the gate electrode; and
   forming an extension region in the predetermined region by setting a part of the offset insulating film positioned over the side of the gate electrode as an offset spacer, and introducing impurities of a predetermined conductive type using the offset spacer as a mask,
   wherein the step of forming the offset insulating film comprises a step of forming a silicon oxide film of a predetermined thickness by repeating one cycle, said one cycle including:
   a first step of adsorbing monosilane ($SiH_4$) to the semiconductor substrate by positioning the semiconductor substrate in a predetermined chamber, introducing the monosilane ($SiH_4$) into the chamber, and exposing the semiconductor substrate to the monosilane ($SiH_4$);
   a second step of emitting the monosilane ($SiH_4$) remaining in the chamber; and
   a third step of oxidizing the monosilane ($SiH_4$) adsorbed to the semiconductor substrate by introducing nitrous oxide ($N_2O$) into the chamber, generating plasma from the nitrous oxide, and exposing the semiconductor substrate to the nitrous oxide plasma.

2. The manufacturing method of a semiconductor substrate according to claim 1, wherein the step of forming the gate electrode comprises the steps of:
   forming a first gate electrode in a first region of the main surface of the semiconductor substrate in such a manner as to laminate a first metal film having a predetermined work function over a first dielectric film having a predetermined dielectric constant; and
   forming a second gate electrode in a second region of the main surface of the semiconductor substrate in such a manner as to laminate a second metal film having a predetermined work function over a second dielectric film having a predetermined dielectric constant,
   wherein the step of forming the offset insulating film comprises the steps of:
   forming a first offset insulating film so as to cover the side of the first gate electrode and the side of the second gate electrode; and
   forming a second offset insulating film over the first offset insulating film,
   wherein the step of forming the extension region comprises the steps of:
   introducing impurities of a first conductive type into the first region using a part of the first offset insulating film positioned over the side of the first electrode as the offset spacer; and
   introducing impurities of a second conductive type into the second region using a part of the first offset insulating film and a part of the second offset insulating film positioned over the side of the second electrode as the offset spacer, and
   wherein the silicon oxide film is formed as the first offset insulating film.

3. The manufacturing method of a semiconductor device according to claim 2, wherein the silicon oxide film is formed as the second offset insulating film.

4. The manufacturing method of a semiconductor device according to claim 1, wherein in the first step, any gas selected from the group comprising helium (He), nitrogen ($N_2$), and argon (Ar) is used as a carrier gas for diluting the monosilane ($SiH_4$).

5. The manufacturing method of a semiconductor device according to claim 1, wherein in the third step, any gas selected from the group comprising helium (He), nitrogen ($N_2$), and argon (Ar) is used as a carrier gas for diluting the nitrous oxide ($N_2O$).

6. A manufacturing method of a semiconductor device, comprising the steps of:
- forming a gate electrode in a predetermined region of a main surface of a semiconductor substrate in such a manner as to laminate a metal film having a predetermined work function over a dielectric film having a predetermined dielectric constant;
- forming a predetermined offset insulating film so as to cover a side of the gate electrode; and
- forming an extension region in the predetermined region by setting a part of the offset insulating film positioned over the side of the gate electrode as an offset spacer, and introducing impurities of a predetermined conductive type using the offset spacer as a mask,
- wherein the step of forming the offset insulating film comprises a step of forming a silicon oxide film of a predetermined thickness with carbon added by repeating one cycle, said one cycle including:
- a first step of adsorbing a precursor of carbon to the semiconductor substrate by positioning the semiconductor substrate in a predetermined chamber, introducing either of the trimethylsilane ($Si(CH_3)_3H$) and tetramethylsilane ($Si(CH_3)_4$) as the precursor into the chamber, and exposing the semiconductor substrate to the precursor;
- a second step of emitting the precursor remaining in the chamber; and
- a third step of oxidizing the precursor adsorbed to the semiconductor substrate by introducing nitrous oxide ($N_2O$) into the chamber, generating plasma from the nitrous oxide, and exposing the semiconductor substrate to the nitrous oxide plasma.

7. The manufacturing method of a semiconductor substrate according to claim 6, wherein the step of forming the gate electrode comprises the steps of:
- forming a first gate electrode in a first region of the main surface of the semiconductor substrate in such a manner as to laminate a first metal film having a predetermined work function over a first dielectric film having a predetermined dielectric constant; and
- forming a second gate electrode in a second region over the main surface of the semiconductor substrate in such a manner as to laminate a second metal film having a predetermined work function over a second dielectric film having a predetermined dielectric constant,
- wherein the step of forming the offset insulating film comprises the steps of:
- forming a first offset insulating film so as to cover the side of the first gate electrode and the side of the second gate electrode; and
- forming a second offset insulating film over the first offset insulating film,
- wherein the step of forming the extension region comprises the steps of:
- introducing impurities of a first conductive type into the first region using a part of the first offset insulating film positioned over the side of the first electrode as the offset spacer; and
- introducing impurities of a second conductive type into the second region using a part of the first offset insulating film and a part of the second offset insulating film positioned over the side of the second electrode as the offset spacer, and
- wherein the silicon oxide film with carbon added is formed as the first offset insulating film.

8. The manufacturing method of a semiconductor device according to claim 7, wherein the silicon oxide film with carbon added is formed as the second offset insulating film.

9. The manufacturing method of a semiconductor device according to claim 6, wherein in the first step, any gas selected from the group comprising helium (He), nitrogen ($N_2$), and argon (Ar) is used as a carrier gas for diluting the precursor.

10. The manufacturing method of a semiconductor device according to claim 6, wherein in the third step, any gas selected from the group comprising helium (He), nitrogen ($N_2$), and argon (Ar) is used as a carrier gas for diluting the nitrous oxide ($N_2O$).

* * * * *